(12) United States Patent
Narita et al.

(10) Patent No.: US 7,650,691 B2
(45) Date of Patent: Jan. 26, 2010

(54) COMPONENT SUPPLY HEAD DEVICE AND COMPONENT MOUNTING HEAD DEVICE

(75) Inventors: Shoriki Narita, Osaka (JP); Satoshi Shida, Osaka (JP); Yasuharu Ueno, Osaka (JP); Makoto Morikawa, Osaka (JP); Hironori Kobayashi, Osaka (JP); Shuichi Hirata, Osaka (JP)

(73) Assignee: Panasonic Corporation, Osaka (JP)

( * ) Notice: Subject to any disclaimer, the term of this patent is extended or adjusted under 35 U.S.C. 154(b) by 235 days.

(21) Appl. No.: 11/596,577

(22) PCT Filed: May 16, 2005

(86) PCT No.: PCT/JP2005/008902

§ 371 (c)(1),
(2), (4) Date: Apr. 16, 2007

(87) PCT Pub. No.: WO2005/112537

PCT Pub. Date: Nov. 24, 2005

(65) Prior Publication Data

US 2008/0040917 A1    Feb. 21, 2008

(30) Foreign Application Priority Data

May 17, 2004 (JP) .............................. 2004-146075
Jun. 4, 2004 (JP) .............................. 2004-167117

(51) Int. Cl.
*H05K 3/30* (2006.01)
(52) U.S. Cl. .............................. 29/832; 29/831; 29/740; 294/64.1; 294/64.2; 294/64.3
(58) Field of Classification Search .................. 29/832, 29/831, 834, 836, 739, 740, 743, 759, 757; 198/339.1, 345.2, 346.2; 294/64.1, 64.2, 294/64.3
See application file for complete search history.

(56) References Cited

U.S. PATENT DOCUMENTS 5,628,111 A * 5/1997 Iwasaki et al. ................ 29/841

(Continued)

FOREIGN PATENT DOCUMENTS

JP    63-84950    6/1988

(Continued)

OTHER PUBLICATIONS

Supplementary European Search Report (in the English language) issued Jun. 27, 2008.

*Primary Examiner*—Derris H Banks
*Assistant Examiner*—Jeffrey Carley
(74) *Attorney, Agent, or Firm*—Wenderoth, Lind & Ponack, L.L.P.

(57) ABSTRACT

A suction nozzle (65) of a reversing head device (22) has a distal end surface (65a) with a suction hole (65b) opened therein, and a suction passage (65c) communicated with the suction hole (65b) at one end thereof. A portion of the distal end surface (65a) outside of the suction hole (65b) abuts against bumps (39) of an electronic component (12). The suction hole (65b) is opposed with a gap to a portion of a mounting side surface (12a) where no bumps (39) are present. A vacuum pump (65) creates an air flow that flows from the gap between the suction hole (65b) and the mounting side surface (12a) into the suction passage (65c) through the suction hole (65b). The electronic component (12) is held at the distal end surface (65a) by a negative pressure generated by the air flow.

3 Claims, 25 Drawing Sheets

U.S. PATENT DOCUMENTS

| | | | |
|---|---|---|---|
| 5,667,129 A * | 9/1997 | Morita et al. | 228/102 |
| 6,135,522 A | 10/2000 | Su et al. | |
| 6,329,640 B1 * | 12/2001 | Narita et al. | 219/390 |
| 2004/0020043 A1 | 2/2004 | Ueno et al. | |

FOREIGN PATENT DOCUMENTS

| | | | |
|---|---|---|---|
| JP | 2-24600 | 2/1990 | |
| JP | 5-253853 | 10/1993 | |
| JP | 7-303000 | 11/1995 | |
| JP | 11-67795 | 3/1999 | |
| JP | 11-233592 | 8/1999 | |
| JP | 2000-269239 | * 9/2000 | |
| JP | 2002-134906 | 5/2002 | |

* cited by examiner

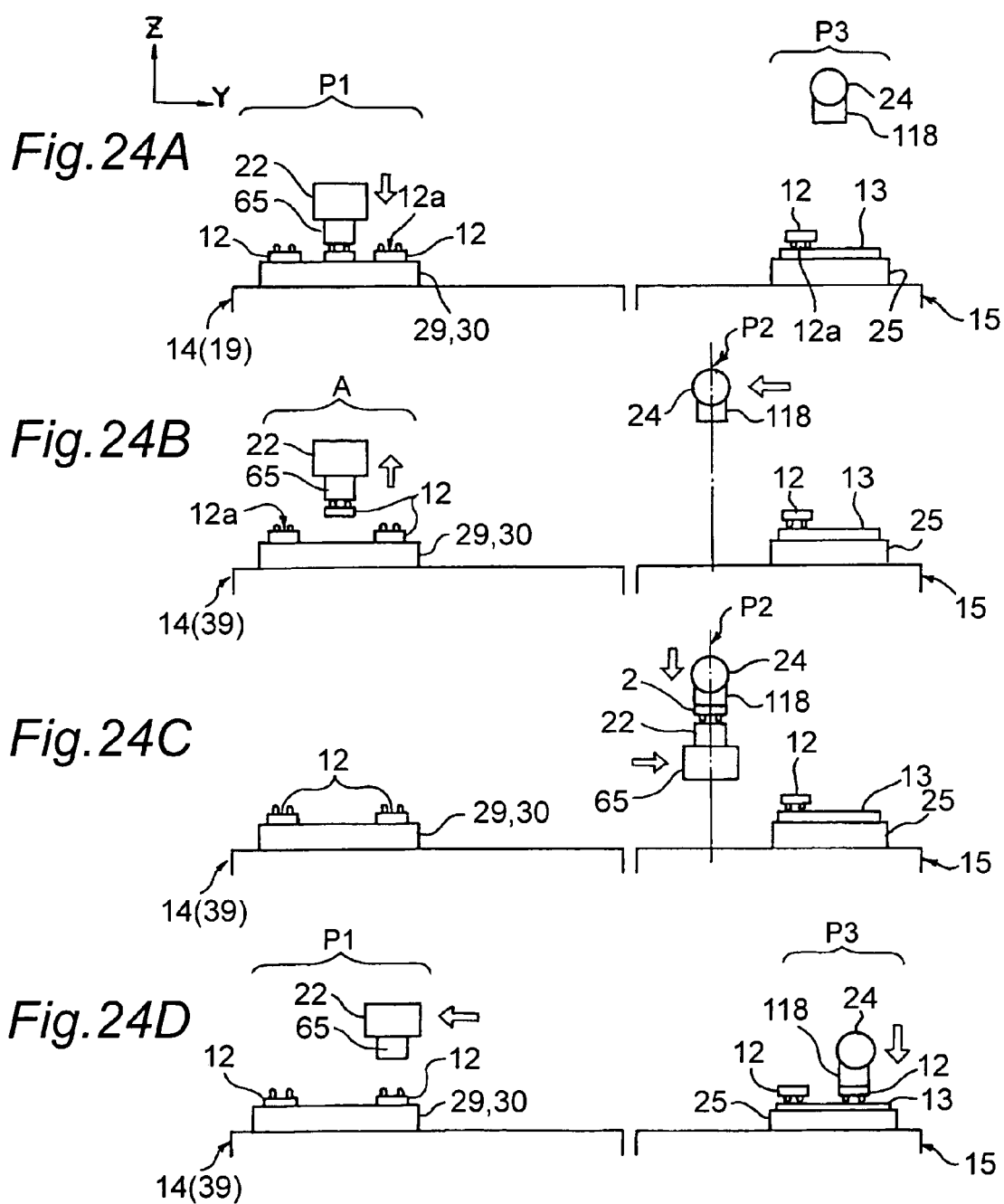

COMPONENT SUPPLY HEAD DEVICE AND COMPONENT MOUNTING HEAD DEVICE

BACKGROUND OF THE INVENTION

1. Technical Field

The present invention relates to a component supply head device for holding a component at a mounting side surface to be mounted on a substrate at a take-out position, moving to a transfer position, and transferring the component to a mounting head device at the transfer position after reversing an orientation of the mounting side surface. Further, the present invention relates to a component mounting head device for holding a component at a non-mounting surface opposite to a mounting side surface to be mounted on a substrate, mounting the mounting side surface onto the substrate.

2. Description of the Related Art

As disclosed in Japanese Patent Application Laid-open Publication No. 8-37395, the above-described component supply head device comprises a suction nozzle for holding a component. The suction nozzle of the conventional component supply head device will be described with reference to FIGS. 25A and 25B. As shown in FIGS. 25A and 25B, bumps 2 are formed on a mounting side surface 1a of an electronic component 1. A suction nozzle shown 3 in FIG. 25A has a profile of a distal end surface 3a set smaller than a space between the bumps 2. A distal end surface 3a of the suction nozzle 3 tightly contacts with an area of the mounting side surface 1a where the bumps 2 are not arranged, and the electronic component 1 is held at the distal end surface 3a of the suction nozzle 3 by a suction force (negative pressure) of a vacuum source (not shown) acting on a suction hole 3c through a suction passage 3b. On the other hand, the suction nozzle 4 shown in FIG. 25B comprises a pyramidal suction hole 4b on a distal end surface 4a, and walls of the suction hole 4b contacts with a peripheral edge of the electronic component 1. While the mounting side surface 1a and burns 2 are not in direct contact with the walls of the suction hole 4b, the electronic component 1 is held at the distal end of the suction nozzle 4 by a suction force of a vacuum source (not shown).

However, in the suction nozzle 3 shown in FIG. 25A, deformation such as warping occurs in the electronic component 1 under the effect of excess suction force acting on a portion (which is in contact with the distal end surface 3a) of the mounting side surface 1a, resulting in that the accuracy of holding the electronic component 1 by the suction nozzle 3 is decreased. The low accuracy of holding the electronic component by the suction nozzle 3 decreases the accuracy of transferring the electronic component 1 from the component supply head device to the mounting head device, and thereby causes a decrease in the component mounting accuracy. Further, in the suction nozzle 4 shown in FIG. 25B, because the walls of the suction hole 4b are brought into contact with the peripheral edge of the electronic component 1, an outer size of the distal end surface 4a has to be set larger than the outer size of the electronic component 1. Thus, in the case where the electronic components 1 are supplied in a state of being accommodated in concave sections formed in a tray, the distal end surface 4a of the suction nozzle 4 may interfere with the concave sections. This interference also decreases the accuracy of holding the electronic component 1 by the suction nozzle 4.

As disclosed in Japanese Patent Application Laid-open Publication No. 2003-297878, the above-described component mounting head device also comprises a suction nozzle for sucking and holding a component. An example of the suction nozzle of the conventional component mounting head device will be described below with reference to FIG. 26. A suction hole 218b is formed in a distal end surface 218a of the suction nozzle 218. The distal end surface 218a of the suction nozzle 218 tightly contacts with a surface (non-mounting side surface 1b) opposite to a mounting side surface 1a of the electronic component 1, and the electronic component 1 is held at the distal end surface 218a of the suction nozzle 218 by a suction force (static pressure) of a vacuum source (not shown) acting in the suction hole 218b through a suction passage 218c. A temperature-adjustable heater 217 is attached to a rear side of the suction nozzle 218. According to a flip chip method such as a solder bump local reflow, C4 (Controlled Collapse Chip Connection), joining using an ACF (Anisotropic Conductive Film), or joining using a NCP (Non Conductive Paste), the electronic component 1 held by the suction nozzle 218 is mounted onto substrate 219 generally by following process. First, the suction nozzle 118 is moved above the substrate 219 and aligned with respect to the substrate 219 so that substrate electrodes 220 formed on the substrate 219 and the bumps 2 of the electronic component 1 correspond to each other. Then, the suction nozzle 118 is lowered so that the bumps 2 are pressed against the substrate electrodes 220. Further, heat generated by the heater 117 is transferred to the electronic component 1 through the suction nozzle 118, thereby heating the bumps 2. The bumps 2 and substrate electrodes 220 are joined by the pressing and heating, and the electronic component 1 is mounted onto the substrate 219.

In the above-described mounting process, the electronic component 1 has to be heated so as to obtain a uniform temperature distribution in the area of the mounting side surface 1a of the electronic component 1 where the bumps 2 are formed (joining area). The nonuniform temperature distribution in the joining area causes non-uniform heating of the plurality of bumps 2, resulting in that the joining state of respective bumps 2 and substrate electrodes 220 corresponding thereto becomes random or nonuniform. As a result, joining defects occur between the electronic component 1 and the substrate 219. In the suction nozzle 118 shown in FIG. 26, the suction force from the suction hole 118c acts only upon a part of the joining area. In other words, the entire non-mounting surface 1b of the electronic component 1 is not attached tightly and uniformly to the suction nozzle 118. As a result, relatively large warping occurs in the electronic component 1 held by the suction nozzle 118. For example, in the case of an electronic component of square shape with a side of about 10 mm and a thickness of about 0.1 mm, the warping is about 14 μm. Because of the relatively large warping, the temperature distribution in the joining area becomes nonuniform, causing joining defects between the electronic component 1 and substrate 219.

SUMMARY OF THE INVENTION

It is an object of the present invention to provide a component supply head device capable of holding a component reliably and with a high degree of accuracy. It is another object of the present invention to provide a component mounting head device capable of heating the element so as to obtain a uniform temperature distribution in the joining area.

A first aspect of the invention relates to a component supply head device for holding a component at a mounting side surface with protruding electrodes to be mounted on a substrate, and reversing an orientation of the mounting side surface of the component to transfer the component to a component mounting head device so that the component mounting head device mounts the component onto the substrate. The component supply head device comprises a suction nozzle provided with a distal end surface where a suction hole is opened and a suction passage communicated with the suction hole at one end thereof. A portion of the distal end surface outside the suction hole abuts against the protruding electrode of the component. The suction hole is opposed with a gap to a portion of the mounting side surface on which the protruding electrodes are not provided. An air flow is generated by vacuum suction force acting from the other end of the suction passage. The air flow flows from the gap between the suction hole and the mounting side surface into the suction passage through the suction hole and generates a negative pressure to hold the component at the distal end surface.

The portion of the distal end surface of the suction nozzle outside the suction holes abuts against bumps, and the suction hole is opposed to the portion of mounting side surface on which the bumps do not exist. The air flow flowing into the suction passage from the gap through the suction hole is generated. The negative pressure (dynamic pressure) generated by the air flow holds the component at the suction nozzle. In other words, the suction nozzle of the component supply head device holds the component in a state where the distal end surface of the suction nozzle is not in contact with the mounting side surface. Therefore, a suction force uniformly acts upon the entire mounting side surface and the component can be held at the suction nozzle with a high degree of accuracy, without causing deformation of the component, such as warping, by an excess suction force. As a result, the accuracy of transferring the component from the component supply head device to the mounting head unit can be enhanced.

The suction hole comprises a center section communicated with the suction passage and a plurality of branch sections extending radially from the center section. The shape of the suction hole increases the uniformity of the suction force created by the negative pressure generated in the gap between the suction hole and the mounting side surface, thereby enhancing the accuracy of holding the component with the suction nozzle.

An outer dimension of the distal end surface is preferably set so that an outer peripheral edge of the distal end surface is positioned inside a peripheral edge of the component held by the suction nozzle and outside the protruding electrodes. Because the outer peripheral edge of the distal end surface of the suction nozzle is positioned on the inside of the peripheral edge of the component, when a component accommodated in a concave section of a tray is sucked and held, the suction nozzle can be prevented from interfering with wall surfaces constituting the concavity. Further, because the outer peripheral edge of the distal end surface of the suction nozzle is positioned outside the bumps, the bumps can be reliably abutted against the distal end surface in the portion outside the suction hole. Therefore, the component can be reliably held at the suction nozzle by the negative pressure generated in the gap between the suction hole and the mounting side surface.

A second aspect of the invention relates to a component mounting head device for holding a component at a non-mounting side surface opposite to a mounting side surface where a plurality of protruding electrodes are provided, and joining the protruding electrodes to corresponding substrate electrodes formed on a substrate to mount the component on the substrate. The component mounting head device comprises a heater for heating the component and a suction nozzle. The suction nozzle comprises a distal end surface where a suction hole is opened and a suction groove communicated with the suction hole is formed in an entire area corresponding to a joining area of the mounting side surface of the component where the protruding electrodes are provided, a proximal end surface opposite to the distal end surface abutting against the heater, and a suction passage communicated with the suction hole at one end thereof. The component is held at the distal end surface by a vacuum suction force acting from the other end of the suction passage.

Because the suction groove connected to the suction hole is formed in the entire area corresponding to the joining area of the component, the entire area of the non-mounting side surface of the component corresponding to the joining area is tightly sucked and held to the distal end surface of the suction nozzle by the suction force acting in the suction hole and suction groove. In other words, the component is sucked and held by the suction nozzle in a state where the component has a high degree of flatness, and warping of the component is substantially reduced. For example, in the case of a component of square shape with a size of about 10 mm and a thickness of about 0.1 mm, the warping is only about 5 μm. Because the component is tightly sucked and held to the suction nozzle in a state where the component has a high degree of flatness, the heat generated by the heater is uniformly transferred to the entire joining area of the component. As a result, the temperature distribution in the joining area becomes more uniform and the protruding electrodes are heated uniformly. Therefore, the plurality of protruding electrodes can be joined to the substrate electrodes in a uniform joining state.

The suction groove may be provided, in addition to the area corresponding to the joining area, outside the area corresponding to the joining area, that is, between the area and the peripheral edge of the suction nozzle.

The arrangement, dimensions, and shape of the suction groove are set so that a non-mounting side surface of the component is sucked and held to the distal end surface of the suction nozzle with a high degree of flatness according to such factors as the shape, dimensions including thickness, and material of the component.

The suction groove may be a combination of frame portions and lattice-like portions. More specifically, the suction groove comprises one closed pattern section disposed along the peripheral edge of the distal end surface, a plurality of first line sections disposed inside the closed pattern section so as to extend in a first direction and be communicated with the closed pattern section at both ends thereof, and a plurality of second line sections disposed inside the closed pattern to as to extend in a direction crossing the first direction and communicated with the first line sections intersecting therewith. The closed pattern section may be polygonal, e.g., quadrangular. Further, the closed pattern section may be in the form of a closed curve such as a circle or an ellipse. The first and second line sections may be straight lines, curved lines such as wavy lines, or polygonal lines.

As an alternative, the suction groove as a whole may have a lattice-like shape. Specifically, the suction groove comprises a plurality of first line sections disposed so as to extend in a first direction, and a plurality of second sections disposed so as to extend in a second direction crossing the first direction and communicated with the first line sections intersecting therewith.

As another alternative, the suction groove may comprise at least one closed pattern section disposed so as to surround a center of the area of the distal end surface corresponding to the joining area, and a plurality of line sections extending radially from the center of the area of the distal end surface corresponding to the joining area and communicated with the closed pattern section intersecting therewith. As described above, the closed pattern section may be polygonal, e.g., quadrangular. Further, the closed pattern section may be in a form of a closed curve such as a circle or an ellipse. The first and second line sections may be straight lines, curved lines such as wavy lines, or polygonal lines.

As yet another alternative, the suction groove can have the form of a single continuous line. Specifically the suction groove may be in the form of a spiral line or may have a rectangular wave-like shape.

The suction nozzle may comprise a recess formed in the distal end surface and separated from the suction hole. The recess is preferably disposed between the suction groove and the peripheral edge of the distal end surface. Even if the air is introduced from a very minute gap between the peripheral edge of the distal end surface of the suction nozzle and the electronic component sucked and held by the suction nozzle, the introduced air is heated while passing through the recess. As a result, the region of the distal end surface of the suction nozzle corresponding to the joining surface is prevented from being cooled by the air introduced from the gap. Therefore, providing the recess further improves the uniformity of temperature distribution in the joining area of the component held by the suction nozzle.

According to the suction nozzle of the component supply head device of the first aspect of the invention, the portion of the distal end surface outside the suction hole abuts against the bumps of the component, whereas the suction hole is opposed to the portion of the mounting side face of the component on which the protruding electrodes are not formed with the gap. This arrangement enables the suction nozzle to hold the component without causing deformation such as warping. Further, when the outer dimension of the distal end surface is set so that the outer peripheral edge of the distal end surface is positioned inside the peripheral edge of the component and outside the protruding electrodes, the distal end of the suction nozzle can be prevented from interfering with the wall surfaces constituting the concavity of the tray in which the component is accommodated. Therefore, the holding accuracy of the component by the suction nozzle is increased and the accuracy of transferring the component to the mounting head device and the component mounting accuracy can be increased. Therefore, accuracy of holding the component by the suction nozzle is enhanced, resulting in increased accuracies of transferring the component to the mounting head device and of mounting the component.

According to the second aspect of the invention, the suction groove connected to the suction hole is formed in the entire area corresponding to the joining area of the component in the distal end surface of the suction nozzle of the component mounting head device. This arrangement assures that the entire area of the non-mounting side surface of the component corresponding to the joining area is tightly sucked and held to the distal end surface of the suction nozzle and the component is sucked and held by the suction nozzle with a high degree of flatness. This results in the uniform temperature distribution in the joining area of the component, which causes the protruding electrodes to be heated uniformly. Therefore, the plurality of protruding electrodes can be joined to the substrate electrodes in the uniform joining state.

BRIEF DESCRIPTION OF THE DRAWINGS

FIG. 24A is a schematic explanatory drawing illustrating a relationship between the reversing head device and component mounting head device;

FIG. 24B is a schematic explanatory drawing illustrating the relationship between the reversing head device and component mounting head device;

FIG. 24C is a schematic explanatory drawing illustrating the relationship between the reversing head device and component mounting head device;

FIG. 24D is a schematic explanatory drawing illustrating the relationship between the reversing head device and component mounting head device;

DETAILED DESCRIPTION OF THE INVENTION

Figure 1:
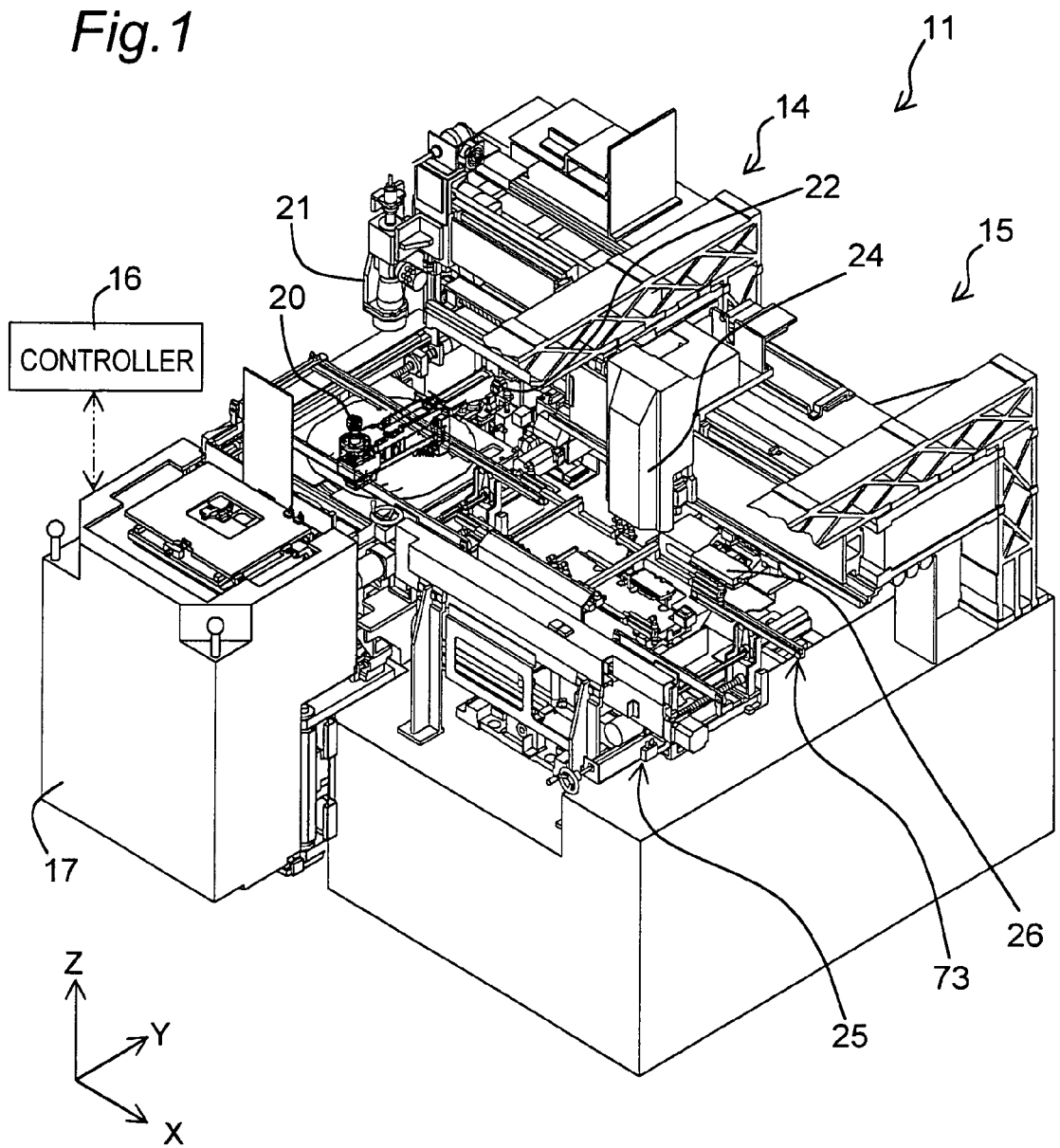
FIG. 1 is a perspective view illustrating a component mounting apparatus of an embodiment of the present invention.
Figure 2:
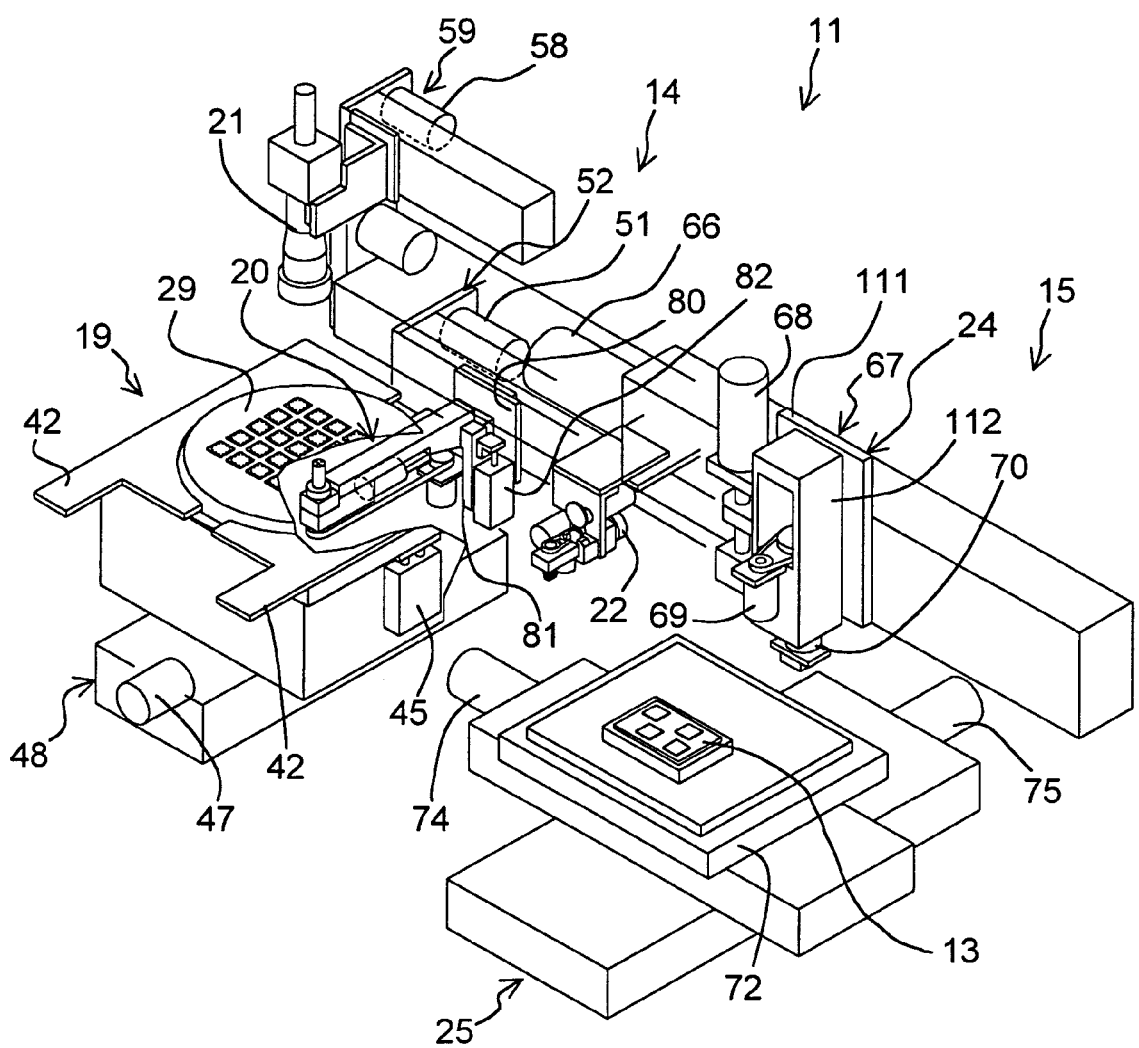
FIG. 2 is a schematic partial perspective view of the component mounting apparatus shown in FIG. 1.
Figure 3:
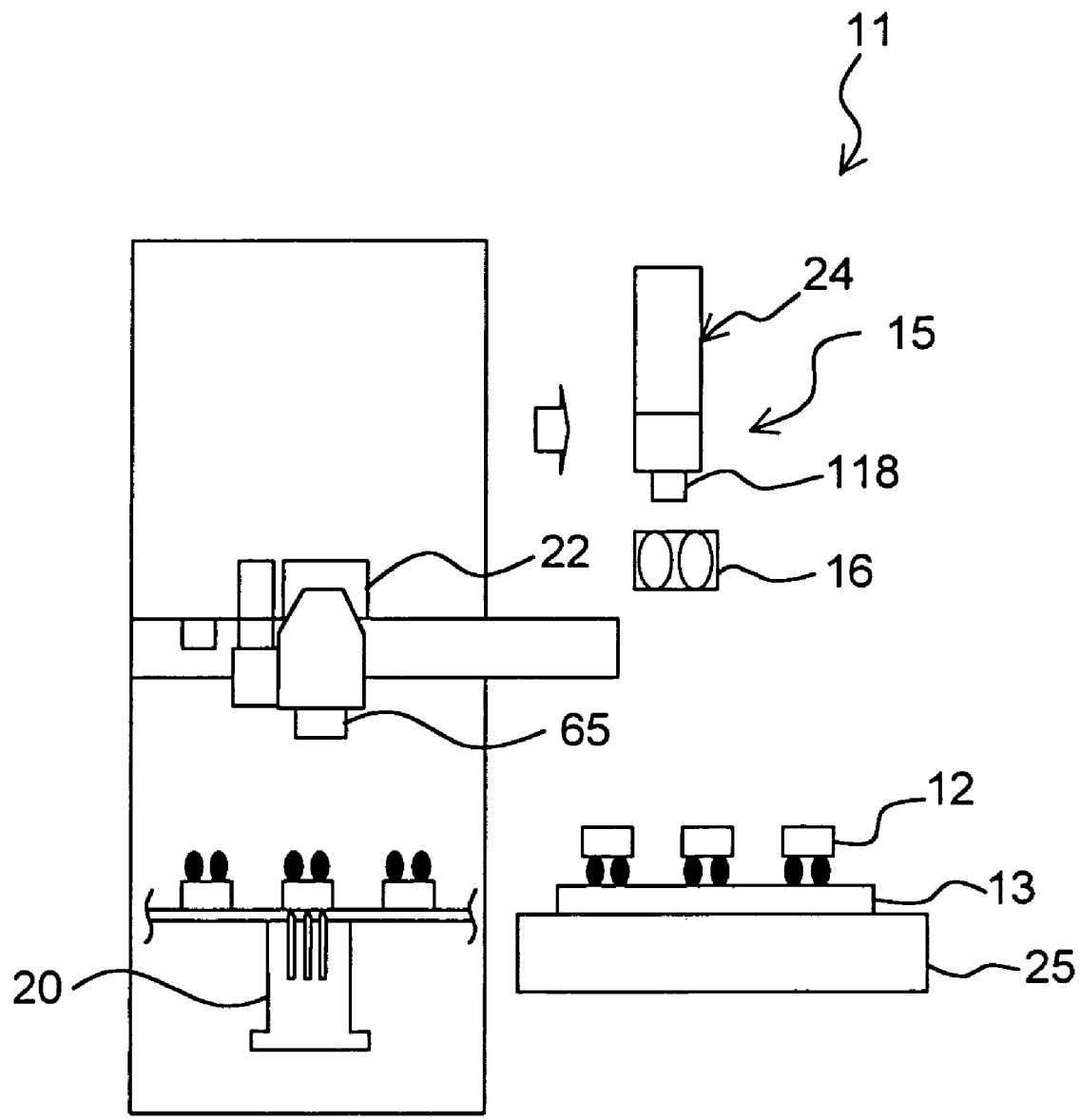
FIG. 3 is a schematic partial front view of the component mounting apparatus shown in FIG. 1.

FIGS. 1 to 3 show an electronic component mounting device 11 according to an embodiment of the present invention which comprises a component supply head device and a component mounting head device.

An entire configuration and operation of the electronic component mounting apparatus 11 will be described. The electronic component mounting apparatus 11 is an apparatus for performing a mounting operation of mounting electronic components 12 including, for example, chip components or bare IC chips onto a substrate 13. The electronic component mounting apparatus generally comprises a component supply section 14 which is an example of a component supply apparatus for accommodating a plurality of electronic components 12 so that they can be supplied and a mounting section 15 for performing a mounting operation of mounting the electronic components 12 supplied from the component supply section 14 on the substrate 13. Further, the electronic component mounting apparatus 11 comprises a control unit or controller 16 for controlling the operation of the component supply section 14 and mounting section 15.

Figure 4:
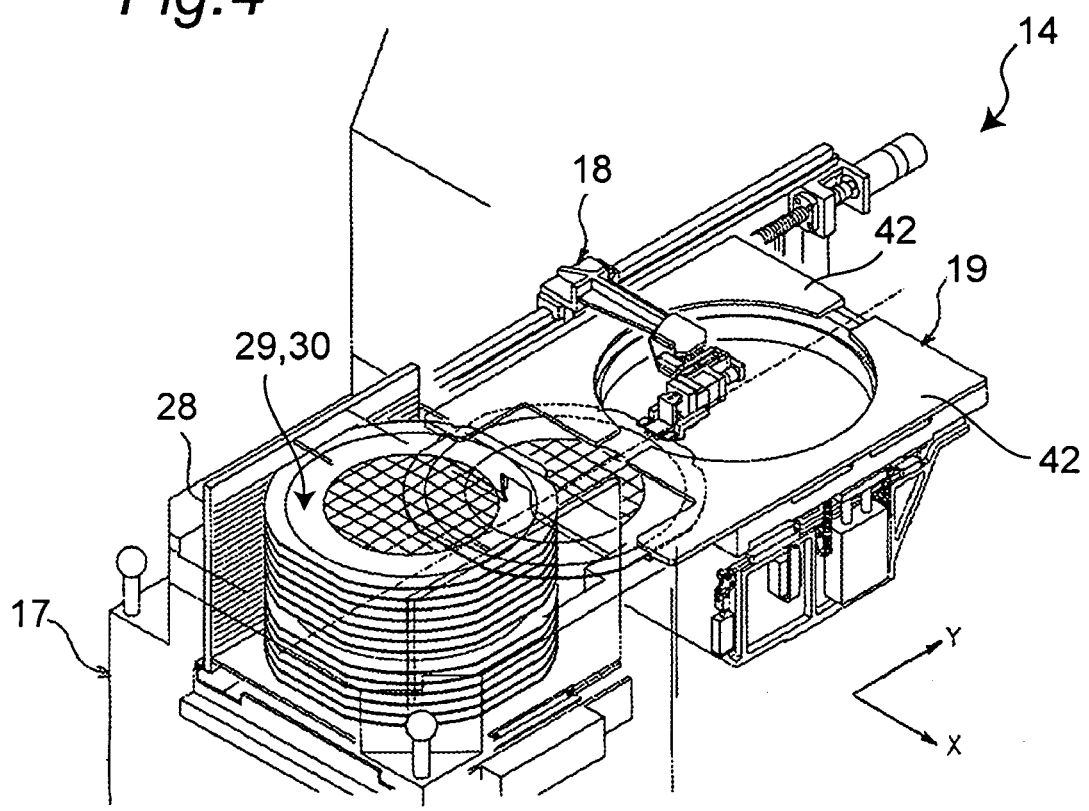
FIG. 4 is a semitransparent perspective view illustrating a component supply apparatus in the component mounting apparatus shown in FIG. 1.

Referring to FIG. 4, the component supply section (component supply apparatus) 14 is provided with a lifter (component supplying and accommodating section) 17, plate translating device 18, plate disposing device (component disposing unit) 19, component ejecting device 20, recognition camera 21, and a reversing head device (component supply head device) 22. On the other hand, the mounting section 15 is provided with a component mounting head device 24, an XY table (alignment device) 25, and a recognition camera with two fields 26.

Figure 5:
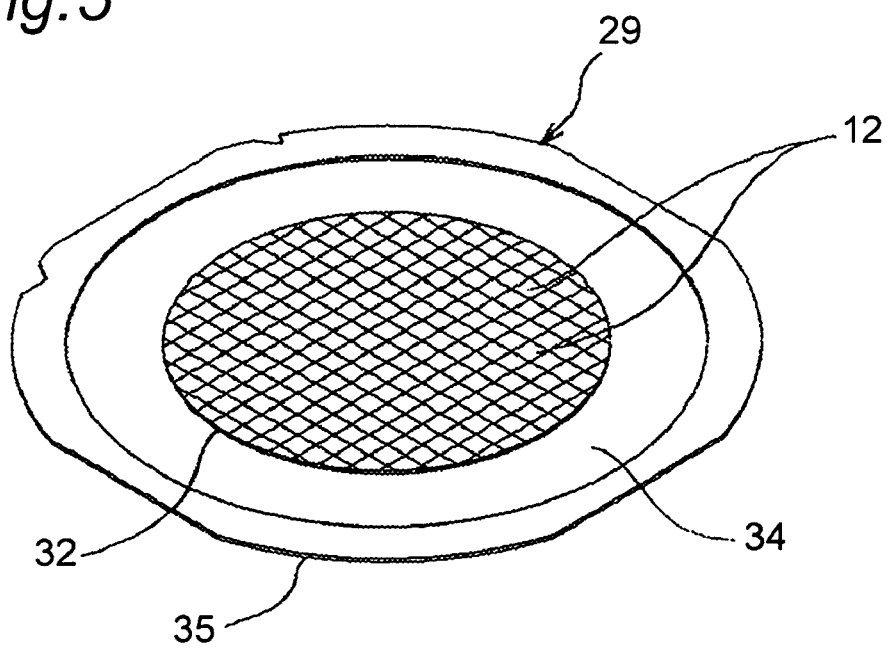
FIG. 5 is a perspective view illustrating a wafer supply plate.
Figure 6:
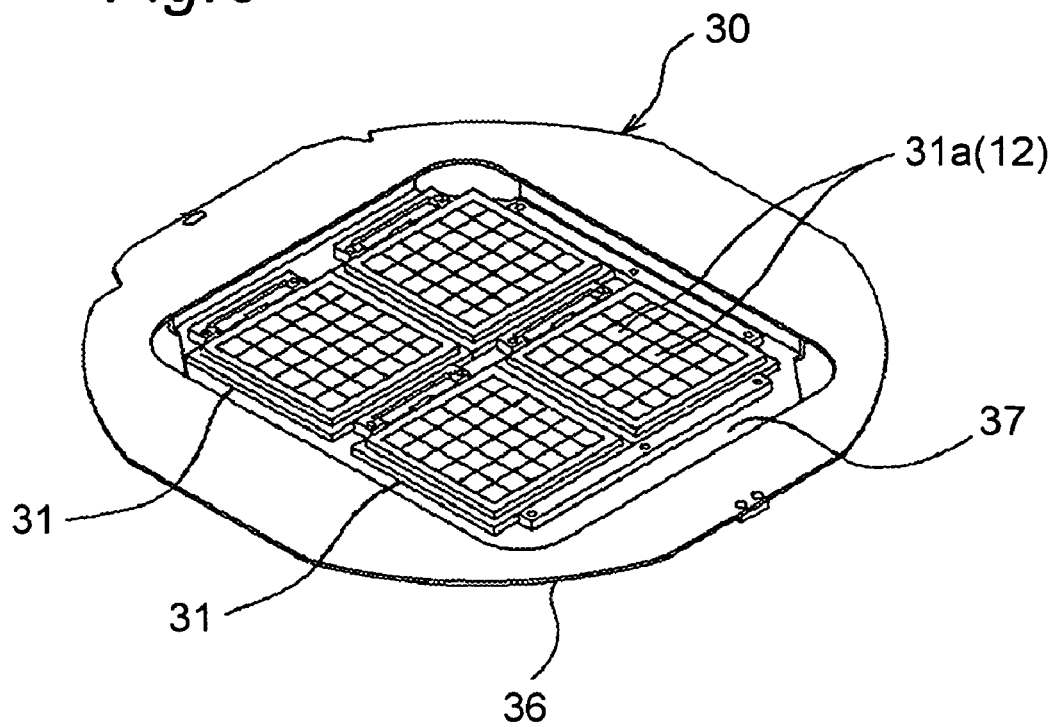
FIG. 6 is a perspective view illustrating a tray supply plate.
Figure 7:
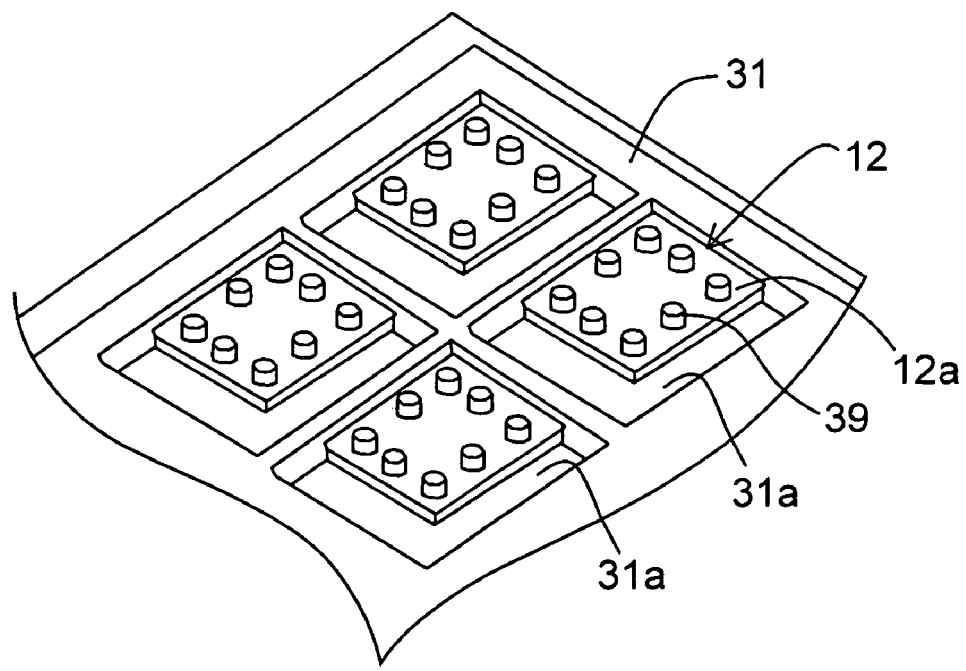
FIG. 7 is a partially enlarged perspective view of the tray shown in FIG. 6.

Further, the component supply section 14 will be described. Referring to FIG. 4, the lifter 17 of the component supply section 14 comprises a magazine 28 that can be moved upward and downward. The magazine 28 accommodates wafer supply plates 29 for supplying electronic components 12 in the form of wafers and tray supply plates 30 for supplying the electronic components 12 contained in trays 31 so that they can be selectively supplied. As shown in FIG. 5, the wafer supply plate 29 generally has a disk-like shape and comprises a wafer sheet 34 and wafer ring 35. The wafer sheet 34 is a stretchable sheet on which wafer 32 that have been subject to dicing. The wafer ring 35 holds the wafer sheet 34 in the vicinity of the outer peripheral edge thereof. The arrangement of the wafer supply plate 29 allows the wafer sheet 34 to be radially extended so that lattice-like arranging positions of the electronic components 12 can be radially extended, resulting in that the so-called "expand" can be conducted. On the other hand, as shown in FIG. 6, the tray supply plate 30 has an outer shape similar to that of the wafer supply plate 29 and comprises a tray ring 36, a tray placing section 37, and a plurality of trays 31. The tray ring 36 is an annular plate having an inner peripheral hole section of generally square shape. The tray placing section 37 is attached to the inner peripheral hole section of the tray ring 36. The trays 31 are detachably placed on the tray placing section 37 for component supply. As shown in the enlarged view of FIG. 7, concave sections 31a for accommodating the electronic components 12 are formed in the component supply trays 31.

The plate translating device 18 shown only in FIG. 4 can move in the Y axis direction and carries the wafer supply plate 29 or tray supply plate 30 that was taken out from the magazine 28 of the lifter 17 to the plate disposing device 19. Both the wafer supply plate 29 and tray supply plate 30 are held by the plate disposing device 19 in a posture such that a mounting side surface 12a of the electronic component 12, on which bumps (protruding electrodes) 39 are formed, is oriented vertically upward and a non-mounting side surface 12b, opposite to the mounting side surface 12a, is oriented vertically downward (see FIG. 7).

Figure 8:
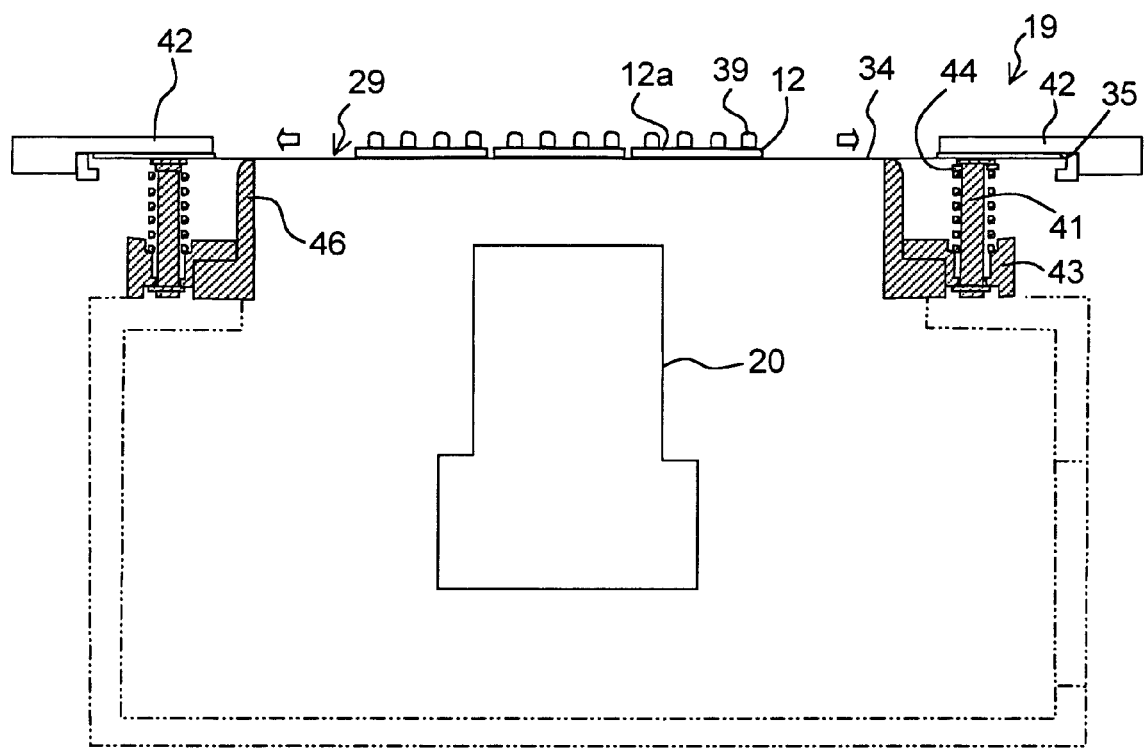
FIG. 8 is a schematic cross-sectional view illustrating a plate disposing device in the component mounting apparatus shown in FIG. 1.
Figure 9:
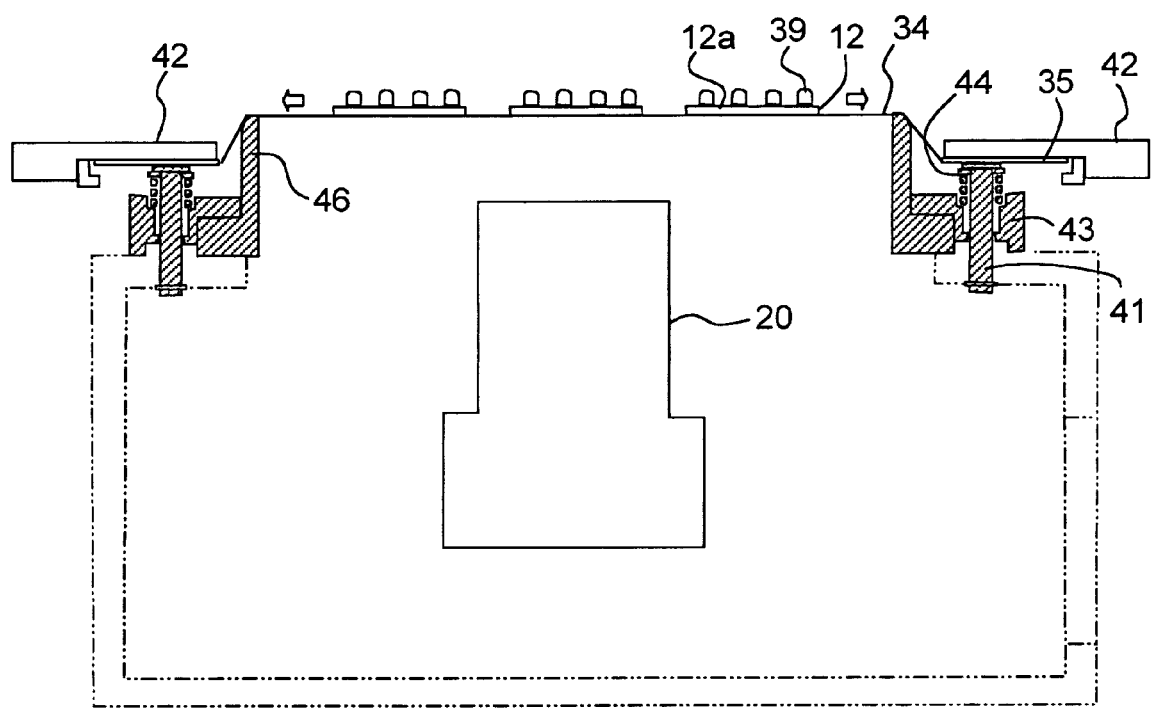
FIG. 9 is a schematic cross-sectional view illustrating a plate disposing device in the component mounting apparatus shown in FIG. 1.

Referring to FIGS. 2, 4, 8, and 9, the plate disposing device 19 comprises plate support pins 41 for supporting a lower surface of the wafer supply plate 29 or tray supply plate 30 and plate push sheets 42 positioned on upper surface sides of those plates. The plate support pins 41 can move in the direction perpendicular to an attachment member 43 having a ring-like shape in the plan view thereof. Further, provided on the plate support pins 41 are coil springs 44, which elastically urge the support pins 41 vertically upward. On the other hand, the plate push sheets 42 can be moved upward and downward by a cylinder 45. Further, an inner side of the attachment member 43 is provided with a cylindrical expand member 46, a distal end of which abuts against a lower surface of the wafer sheet 34. As shown in FIG. 8, the wafer supply plate 29 is sandwiched between distal end portions of the plate support pins 41 and the plate push sheets 42. When the plate push sheets 42 are lowered by the cylinder 45 from the position shown in FIG. 8, the wafer sheet 34 will extend radially, with the distal end of the expand member 46 serving as a support point, as shown in FIG. 9. As a result of this so-called "expand" operation, spaces between adjacent electronic components 12 are enlarged. The tray supply plate 30 is held by the plate disposing device 19 in a similar manner. As clearly shown in FIG. 2, the plate disposing device 19 can be moved in the Y axis direction by the Y axis robot 48 having a driving motor 47.

Referring to FIGS. 2, and 10 to 14, the component ejecting device 20 can be moved in the X axis direction by an X axis robot 52 having a driving motor 51. Further, the component ejecting device 20 comprises an ejecting head 54 at a distal end of an arm 53. Ejecting needles or ejecting pins 56 are accommodated in a holder 55 of the ejecting head 54 so that the ejecting pins 56 can be moved upward and downward. The ejecting pins 56 push up the electronic components 12 adhered to the wafer sheet 34 from the lower surface of the electronic components 12, thereby peeling the electronic components 12 off the wafer sheet 34. Further, the ejecting head 54 can be rotated about the Z axis. The structure and operation of the component ejecting device 20 will be described later in detail.

Referring to FIGS. 1 and 2, an X axis robot 59 with a driving motor 58 is equipped with a recognition camera 21, and thus the recognition camera 21 is movable in the X axis direction. The recognition camera 21 optically recognizes the position of the electronic components 12 in the wafer supply plate 29 or tray supply plate 30 held in the plate disposing device 19.

Figure 15:
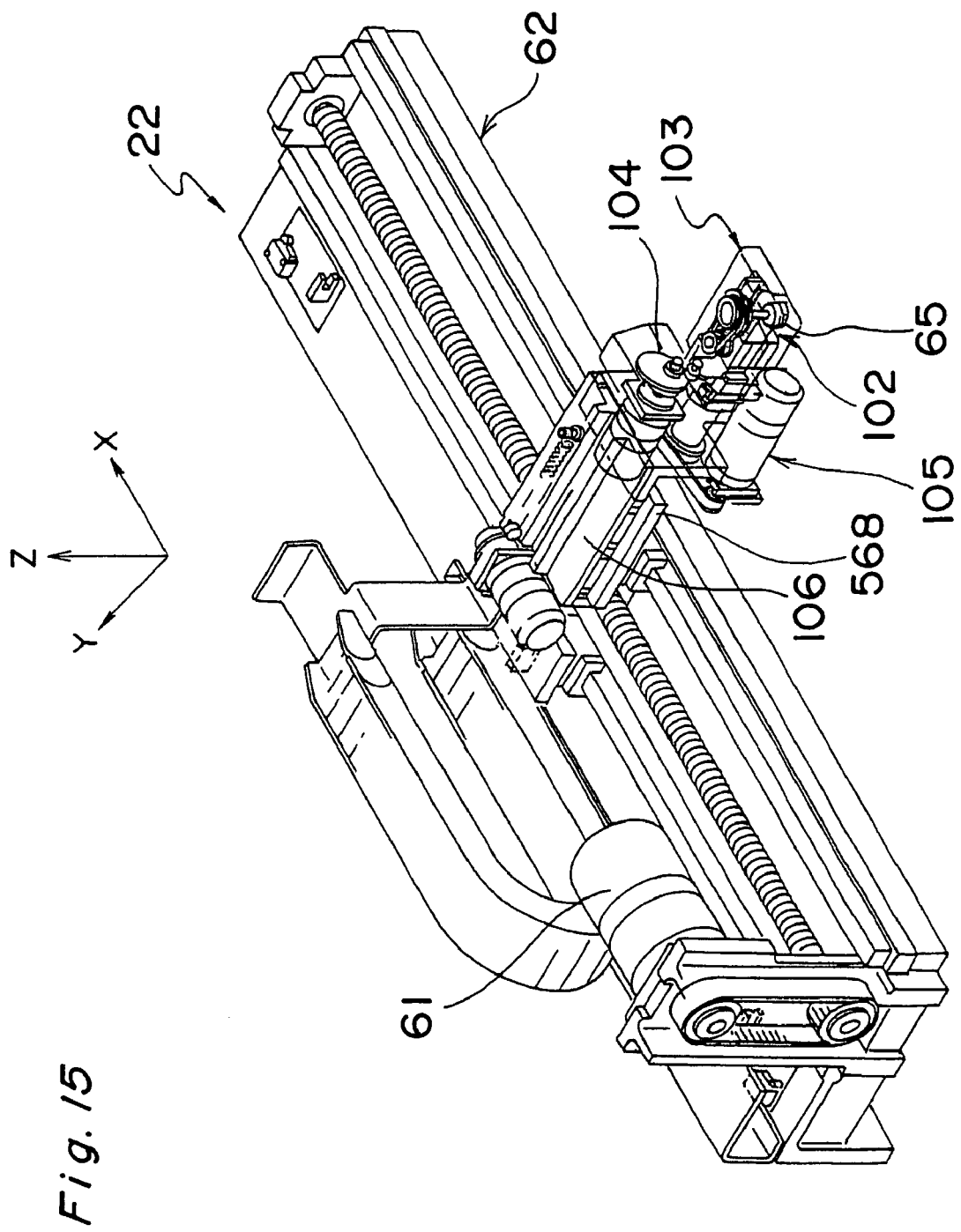
FIG. 15 is a perspective view illustrating a reversing head device in the component mounting apparatus shown in FIG. 1.

Referring to FIGS. 2 and 15, the reversing head device 22 can be moved in the X axis direction by an X axis robot 62 having a driving motor 61. The reversing head device 22 comprises a suction nozzle 65 for removably sucking and holding the mounting side surface 12a of the electronic component 12 by a suction force of a vacuum pump 63 (see FIG. 16A). The suction nozzle 65 can be moved upward and downward and rotated about the Z axis. Further, an orientation in the vertical direction of the suction nozzle 65 can be reversed. The structure and operation of the reversing head device 22 will be described below in detail.

Figure 18:
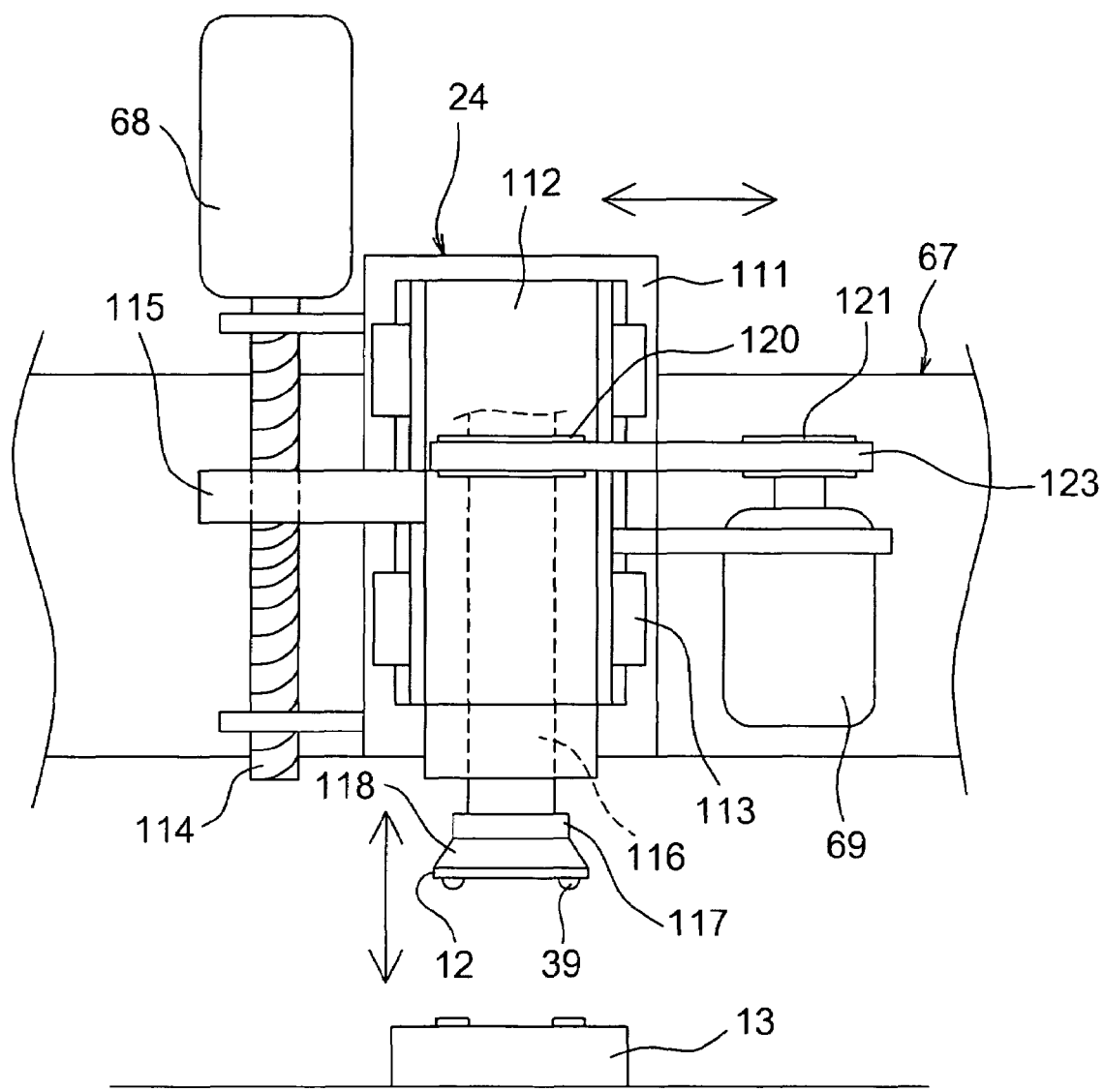
FIG. 18 is a schematic front view of a component mounting head device.

Referring to FIGS. 1, 2, and 18, the component mounting head device 24 can be moved in the direction of the X axis by an X axis robot 67 actuated by a driving motor 66. The component mounting head device 24 comprises a suction nozzle 118 for removably sucking and holding the non-mounting side surface 12b of the electronic component 12 by a suction force of a vacuum pump 125 (see FIG. 19). The suction nozzle 118 can be moved upward and downward and rotated about the Z axis. The structure and operation of the component mounting head device 24 will be described below in detail.

Referring to FIG. 2, a substrate holder (substrate holding section) 72 for releasably holding and fixing the substrate 13 is arranged on an upper surface of the XY table 25. This substrate holder stand 72 holds the substrate 13 that has been supplied from a substrate carrying device 73 (FIG. 1) that carries the substrate 13 leftward in the direction of X axis. The XY table 25 comprises motors 74, 75 for driving in the X and Y axis directions and can move the substrate 13 held by the substrate holder 72 in the X and Y axis directions. This movement can align the electronic component 12 held by the component mounting head device 24 with respect to the substrate 13.

The recognition camera 26 with two fields (see FIG. 1) optically recognizes both the electronic component 12 held by the component mounting head device 24 and the substrate 13.

The overall operation of the component supply section 14 and mounting section 15 will be generally described below. The plate translating device 18 takes the wafer supply plate 29 out of the magazine 28 of the lifter 17, moves the plate in the Y axis direction, and supplies it to the plate disposing device 19. After the holding of the wafer supply plate 29 by the plate disposing device 19 (FIG. 8) and the expand operation (FIG. 9) have been completed, the ejecting head 54 is aligned with respect to any one of the electronic components 12 according to the recognition results of the recognition camera 21. The alignment is achieved by the movement of the plate disposing device 19 in the Y axis direction performed by the Y axis robot 48 and the movement of the component ejecting device 20 in the X axis direction performed by the X axis robot 52. Further, the reversing head device 22 is aligned with respect to the same electronic component 12 by the movement of the reversing head device 22 in the X axis direction performed by the X axis robot 62. Synchronously with the suction operation performed by the suction nozzle 65 of the reversing head device 22, the electronic component 12 is pushed up from the lower surface side of the wafer sheet 34 by the ejecting pins 56 of the component ejecting device 20, and thereby the electronic component 12 is peeled off from the wafer sheet 34 and held by the suction nozzle 65.

The reversing head device 22 holding the electronic component 12 with the suction nozzle 65 moves in the X axis direction as far as a transfer position P2 (see FIG. 24) of the electronic component 12 and reverses the orientation of the suction nozzle 65. The component mounting head device 24 is also moved in the X axis direction as far as the transfer position P2 by the X axis robot 67. After the electronic component 12 has been sucked and held by the suction nozzle 118 of the component mounting head device 24, the suction by the suction nozzle 65 of the reversing head device 22 is released. As a result, the electronic component 12 is transferred from the reversing head device 22 to the mounting head device 24.

The mounting head device 24 to which the electronic component 12 has been transferred moves above the substrate 13 on the XY table 25. The substrate 13 is aligned with respect to the electronic component 12 held by the suction nozzle 118 of the mounting head device 24 according to the recognition results by the recognition camera with two fields 26. The alignment is achieved by the movement of the substrate 13 in the X and Y axis directions performed by the XY table 25. After this alignment, the mounting head device 24 mounts the electronic component 12 onto the substrate 13. Similar operations are executed with respect to the tray supply plate 30.

Figure 10:
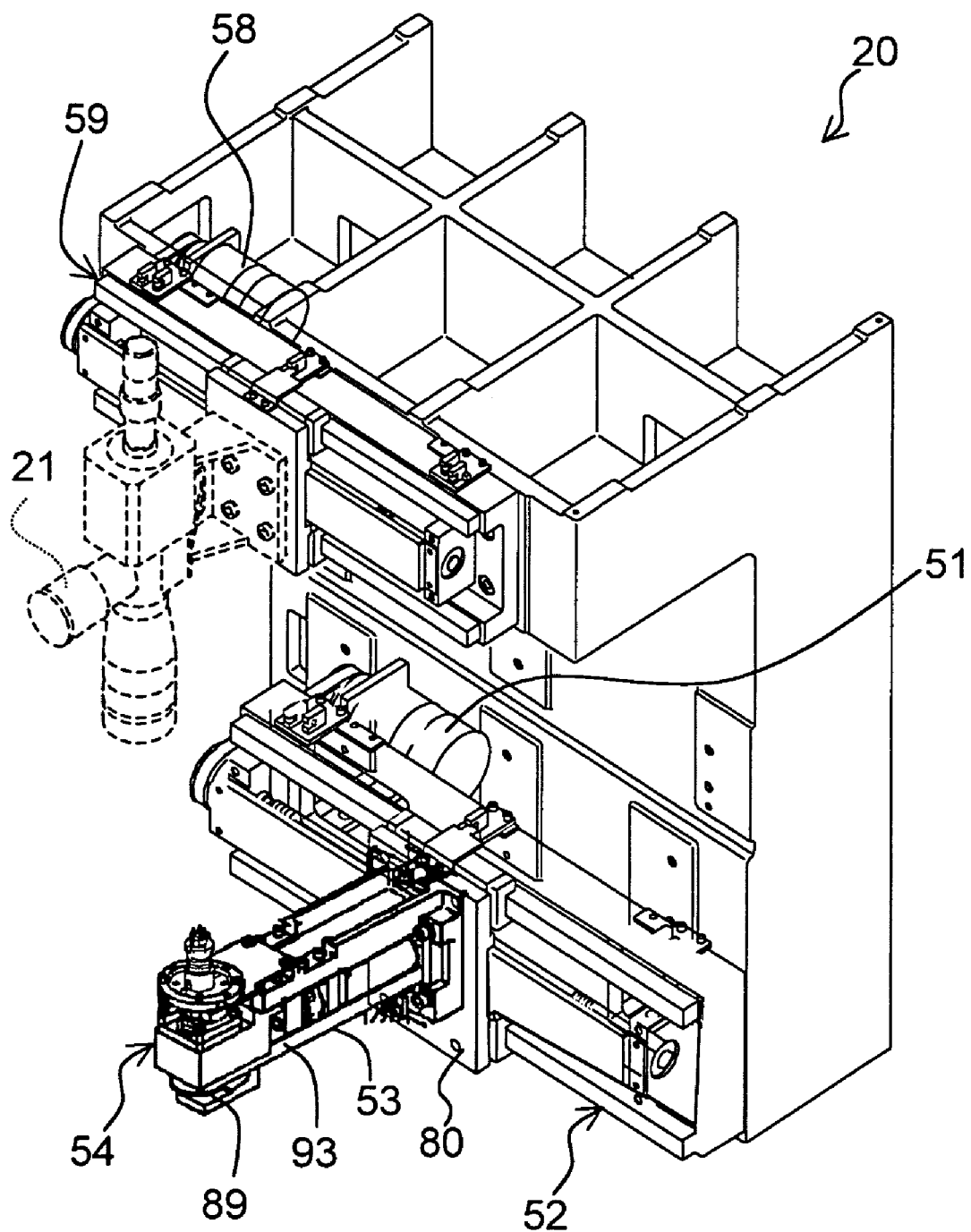
FIG. 10 is a perspective view illustrating a component ejecting device in the component mounting apparatus shown in FIG. 1.
Figure 11:
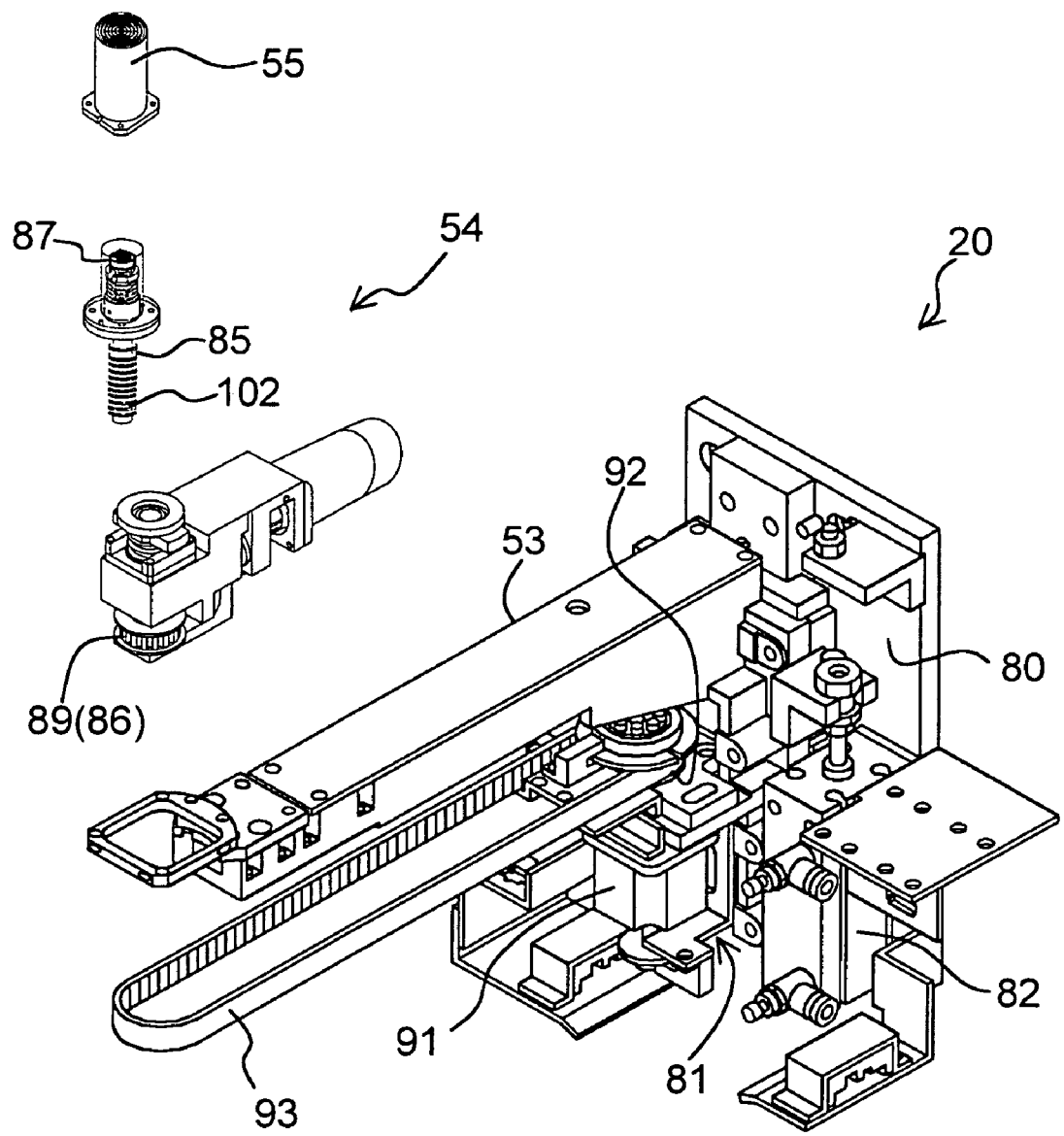
FIG. 11 is an exploded perspective view illustrating the component ejecting device in the component mounting apparatus shown in FIG. 1.

The component ejecting device 20 will be described below in greater detail with reference to FIGS. 1, 2, and 10 to 14. As shown in FIGS. 2, 10, and 11, the component ejecting device 20 comprises a base unit 80 installed on the X axis robot 52 having the drive motor 51. A proximal end side of the arm 53 extending in the Y axis direction is connected to the base unit 80. The proximal end side of the arm 53 is connected to the base unit 80 through an LM guide or linear motion guide 81 extending in the Z axis direction so that the entire arm 53 is moved upward and downward by a cylinder 82 supported by the base unit 80.

Figure 12:
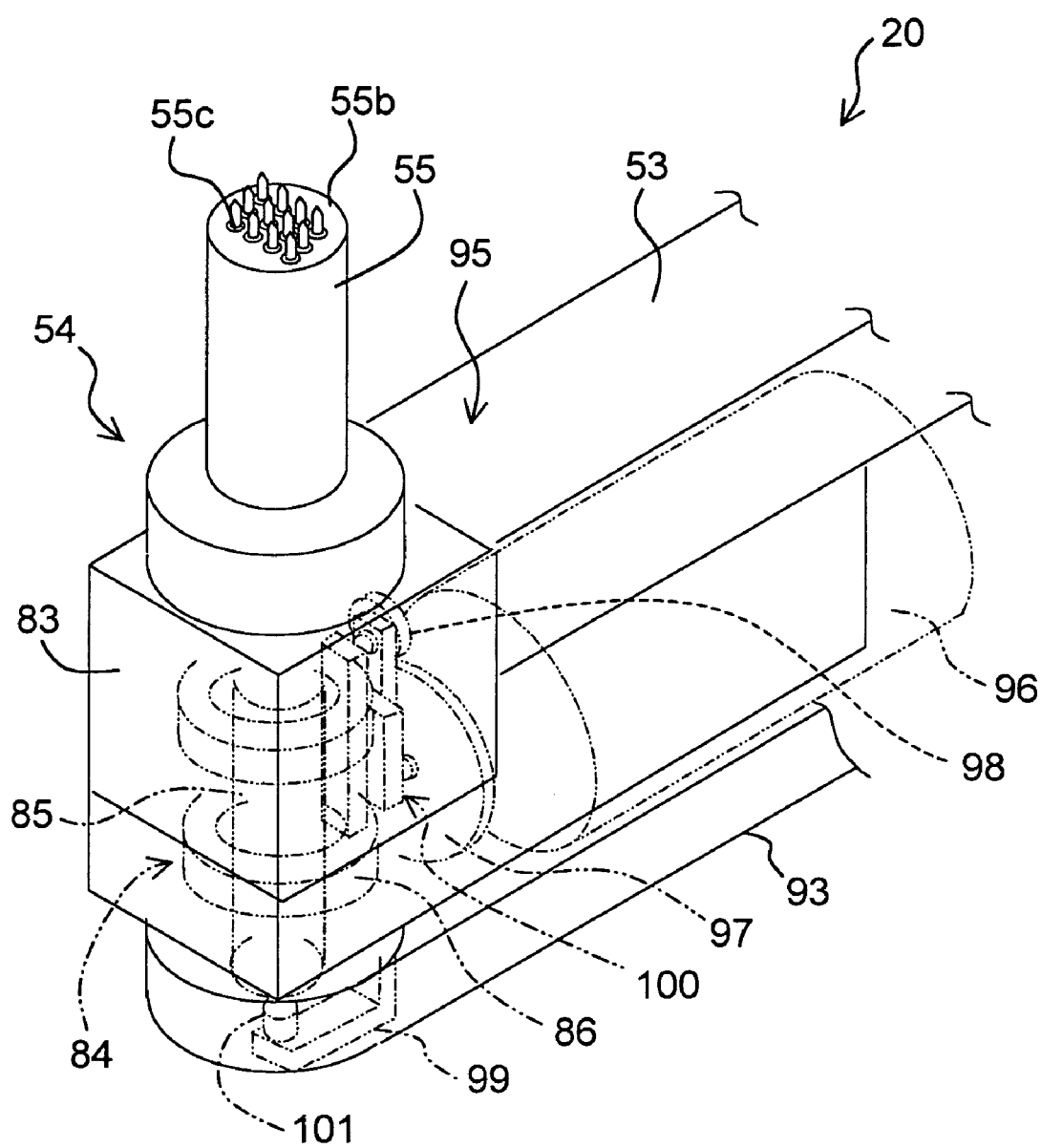
FIG. 12 is a partial perspective view illustrating an ejecting head of the component ejecting device in the component mounting apparatus shown in FIG. 1.
Figure 13:
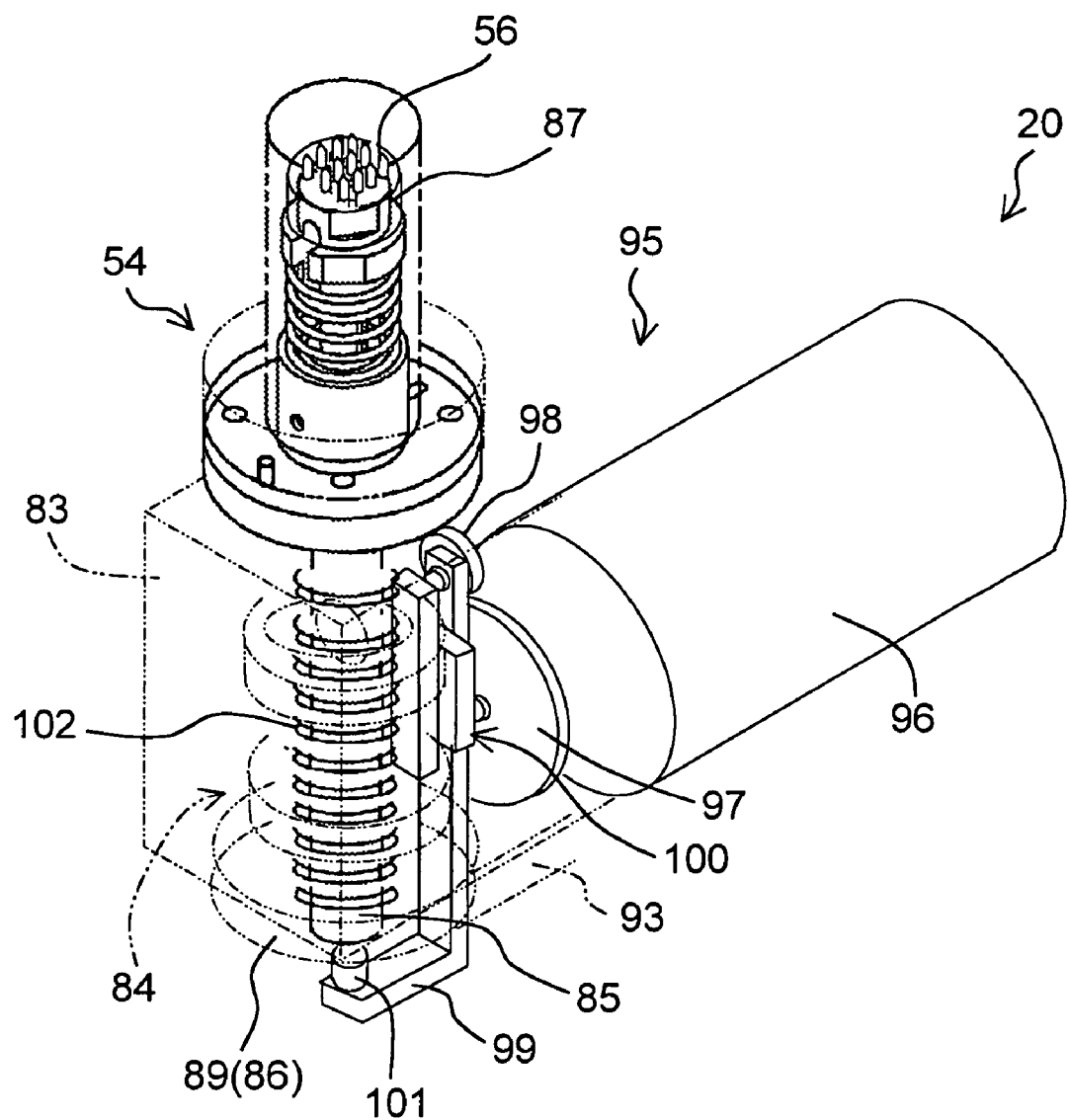
FIG. 13 is a partial perspective view illustrating an internal structure of the ejecting head shown in FIG. 12.
Figure 14:
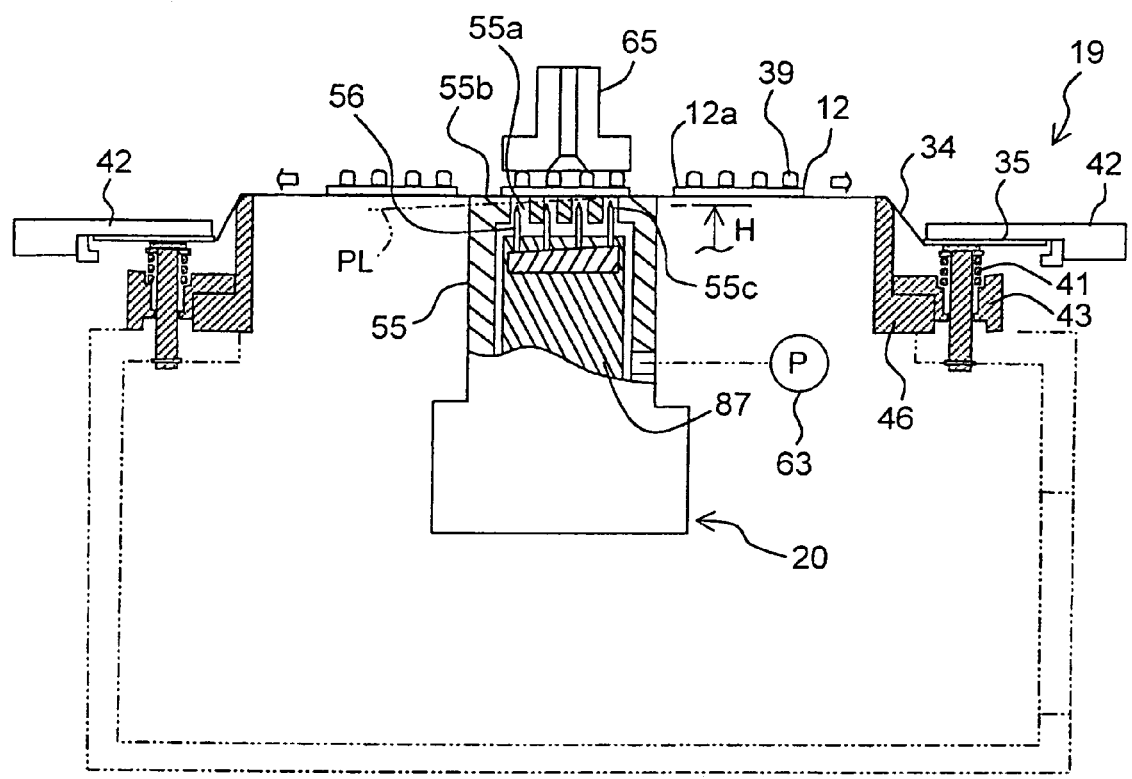
FIG. 14 is a schematic cross-sectional view illustrating the plate disposing device and the component ejecting device in the component mounting apparatus shown in FIG. 1.

As shown in FIGS. 12 to 14, the arm 53 has at the distal end thereof the ejecting head 54. As most clearly shown in FIG. 14, the ejecting head 54 is positioned below the wafer supply plate 29 held by the plate disposing device 19. The ejecting head 54 has a casing 83 fixed to the distal end of the arm 53. A ball spline 84 is attached to the casing 83 so that a spline shaft 85 of the ball spline 84 extends in the vertical direction, and a pin fixing member 87, to which proximal end sides of the plurality of ejecting pins 56 is fixed, is connected to a distal end side of the spline shaft 85. A rotation unit 86 of the ball spline 84 is attached to the casing so as to be rotatable with respect to the casing 83, and a pulley 89 is fixed on the outer periphery thereof. As shown in FIGS. 11 and 12, a driving belt 93 is arranged between the pulley 89 and a pulley 92 fixed to an output shaft of a motor 91 disposed at the proximal end side of the arm 53. Therefore, the rotation of the motor 91 is converted into the rotation of the spline shaft 85 about the Z axis direction through the pulleys 89 and 92, drive belt 93, and rotation unit 86.

Referring to FIGS. 12 and 13, the component ejecting device 20 comprises a lift driving mechanism 95 for moving the spline shaft 85 upward and downward. Specifically, a cam follower 98 abutting against a cam 97 fixed to the output shaft of the motor 96 is attached to an upper end of a lever 99. The lever 99 can be advanced in the vertical direction by an advance guide 100 supported by the casing 83. Further, a protrusion 101 provided at an L-shaped lower end of the lever 99 abuts against a lower end of the spline shaft 85. Furthermore, a coil spring 102 is fitted onto the spline shaft 85. The spline shaft 85 is elastically urged downward in the vertical direction by the coil spring 102. As a result, the lower end of the spline shaft 85 constantly abuts against the protrusion 101. The rotation of the motor 96 is converted into linear motion by the cam 97 and the cam follower 98, and the linear motion is transmitted to the spline shaft 85 by the lever 99.

An upper end side of the spline shaft 85 is inserted into a hollow holder 55 fixed to the casing 83. As shown in FIG. 14, a distal end surface of the holder 55 abuts against the lower surface of the wafer sheet 34. Further, a plurality of sheet suction holes 55*a* are provided in the distal end surface of the holder 55, and the lower surface of the wafer sheet 34 is sucked to and held at the distal end surface 55*b* of the holder 55 by the suction force of a vacuum pump 63 (shown only in FIG. 14) acting through the sheet suction holes. The pin fixing member 87 is fixed to the upper end of the spline shaft 85 positioned inside the holder 55. The plurality of ejecting pins 56 are fixed to the pin fixing member 87.

The operation of the component ejecting device 20 will be described below. As already described with reference to FIGS. 8 and 9, the expand operation of the wafer sheet 34 is executed by the plate disposing device 19. Then, after the arm 53 is moved upward so that the distal end surface of the holder 55 is abutted against the lower surface of the wafer sheet 34, the vacuum pump 63 is actuated and the lower surface of the wafer sheet 34 is sucked and held to the sheet suction holes 55*a* (see FIG. 14). In a case where the type of electronic components 12 is changed, the angular position of the pin fixing member 87 around the Z axis can be adjusted by rotating the spline shaft 85 by the motor 91, thereby the arrangement position in the plan view of the plurality of ejecting pins 56 can be adjusted according to the type of the electronic components 12. Then, the recognition camera 21 recognizes the position of the electronic component 12 which is to be ejected. The reversing head device 22 moves according to the recognition results of the recognition camera 21, the suction nozzle 65 is thereafter lowered and the suction of the electronic component 12 is stared. Synchronously with the upward movement of the suction nozzle 65, the ejecting operation of the electronic component 12 by the ejecting pins 56 is executed. The suction nozzle 65 moves upward as well as sucks and holds the electronic component 12 peeled off from the wafer sheet 34 by the ejecting operation.

The reversing head device 22 will be described below in detail. Referring to FIGS. 2 and 15, the reversing head device 22 comprises a reversing head 103 having the suction nozzle 65 for releasably sucking and holding the electronic component 2 and a rotation driving device 102 for rotating the suction nozzle 65 about the Z axis. Further, the head reversing device 22 comprises a head lifting device 104 and a reversing device 105. The head reversing device 22 moves the reversing head 103 upward and downward for achieving the upward and downward movement of the suction nozzle 65. The reversing device 105 supports the reversing head 103 movably upward and downward and rotates the reversing head 103 about a reversing center extending along the Y axis direction for achieving reversing of the orientation of the suction nozzle 65 in the vertical direction. Further, the head reversing device 22 comprises a head frame 106 for supporting a head lifting device 104 and reversing device 105. The head frame 106 is installed on the X axis robot 62 having the driver motor 61. Therefore, the reverse head 103 moves back and forth in the X axis direction between a take-out position P1 of the electronic component 12 (see FIG. 24A) and the transfer position P2 of the electronic component 12 (see FIG. 24B).

Figure 16A:
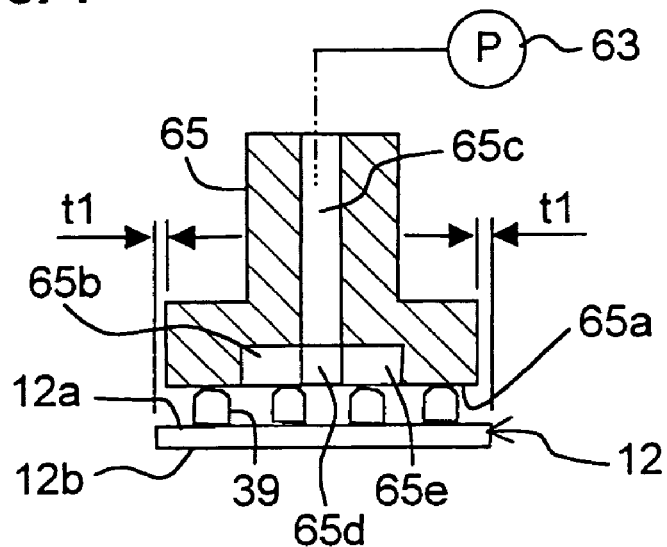
FIG. 16A is a schematic longitudinal sectional view of a suction nozzle in the reversing head device.
Figure 16B:
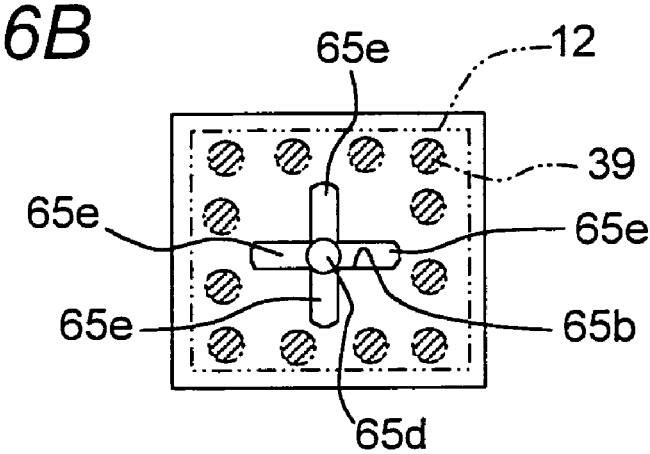
FIG. 16B is a schematic bottom view of the suction nozzle shown in FIG. 16A.

Referring to FIGS. 16A and 16B, the suction nozzle 65 comprises a suction hole 65*b* opened at a flat distal end surface 65*a* and a suction passage 65*c* communicated with the suction hole 65*b* at one end thereof. The vacuum pump 63 is connected to the other end of the suction passage 65*c*. The suction hole 65*b* comprises a center section 65*d* communicated with the suction passage 65*c* and a plurality of branch sections 65*e* extending radially from the center section 65*d*. In the present embodiment, four branch sections 65*e* disposed with angular spaces of 90 degrees in the plan view or bottom view thereof are provided. The shape and size of the suction hole 65*b* and distal end surface 65*a* are set so that the portion of the distal end surface 65*a* outside of the suction hole 65*b* abuts against the bumps 39 of the electronic component 12 and also so that the suction hole 65*b* is opposed, with a gap, to a portion of the mounting side surface 12*a* on which the bumps 39 are not provided. For this reason, a suction operation of the vacuum pump 63 generates an air flow flowing from the gap between the distal end surface 65*a* of the suction nozzle 65 and the mounting side surface 12*a* into the suction passage 65*c* through the suction hole 65*b*. The negative pressure (dynamic pressure) generated by the air flow holds the component 12 at the distal end surface 65*a*. In other words, the distal end surface 65*a* of the suction nozzle 65 of the reversing head device 22 sucks and holds the electronic component 12 in a state where the distal end surface 65*a* is not in contact with the mounting side surface 12*a*. Therefore, the suction force uniformly acts on the entire mounting side surface 12*a* and the electronic component 12 can be held on the suction nozzle 65 with high accuracy, without causing deformation, such as warping, by an excess suction force.

Figure 16C:
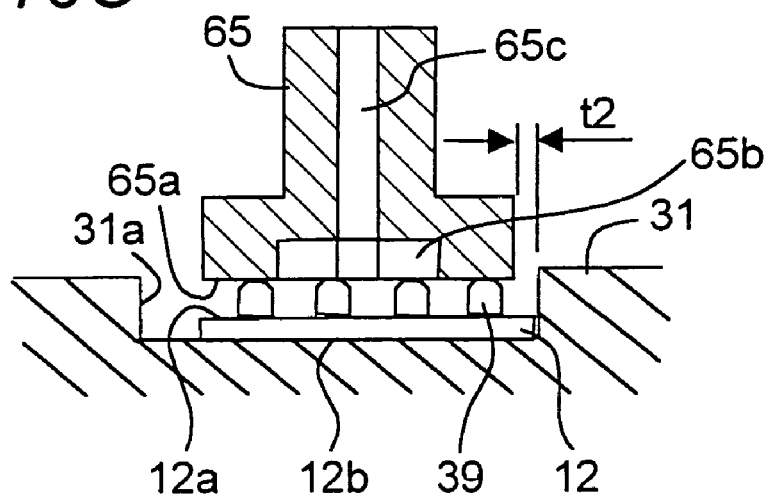
FIG. 16C is a schematic longitudinal sectional view illustrating a relationship between a concavity of a tray and the suction nozzle shown in FIG. 16A.

Further, as shown by a reference symbol t1 in FIG. 16A, the outer dimensions of the distal end surface 65*a* of the suction nozzle 65 are set so that the outer peripheral edge of the distal end surface 65*a* is positioned inside the peripheral edge of the electronic component 12 for example by 25-50 µm. Therefore, as shown in FIG. 16C, even when the electronic component 12 accommodated in the concave section 31*a* of the tray 31 abuts against a wall surface constituting the concave section 31*a*, a gap of about 25-50 µm shown by a reference symbol t2 is ensured between the distal end surface 65*a* of the suction nozzle 65 and the wall surface of the concave section 31*a*, and the suction nozzle 65 can be prevented from interfering with the wall surface of the concave section 31*a*. Further, the outer dimensions of the distal end surface 65*a* of the suction nozzle 65 are set so that the outer peripheral edge of the distal end surface 65*a* is located outside the bump 39. Therefore, because the bump 39 can be reliably abutted against the distal end surface 65*a* in the portion outside the suction hole 65*b*, the electronic component 12 can be reliably held at the suction nozzle 65 by the negative pressure generated in the aforementioned gap between the suction hole 65*b* and mounting side surface 12*a*.

Figure 17A:
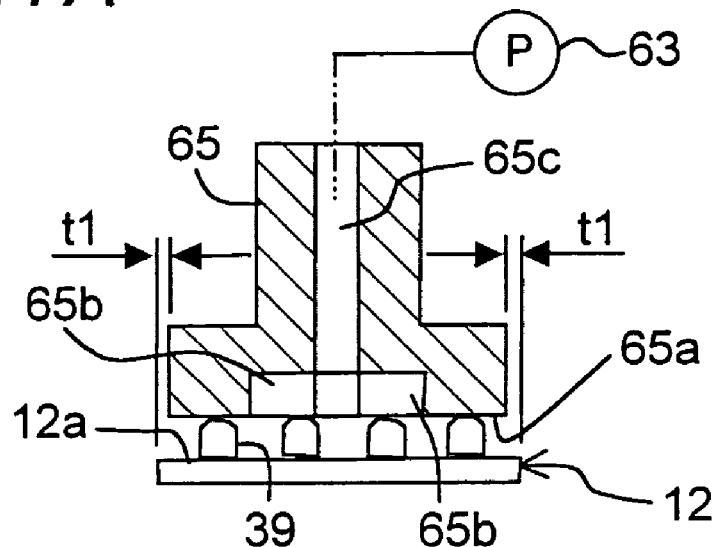
FIG. 17A is a schematic cross-sectional view of an alternative suction nozzle for the reversing head device.
Figure 17B:
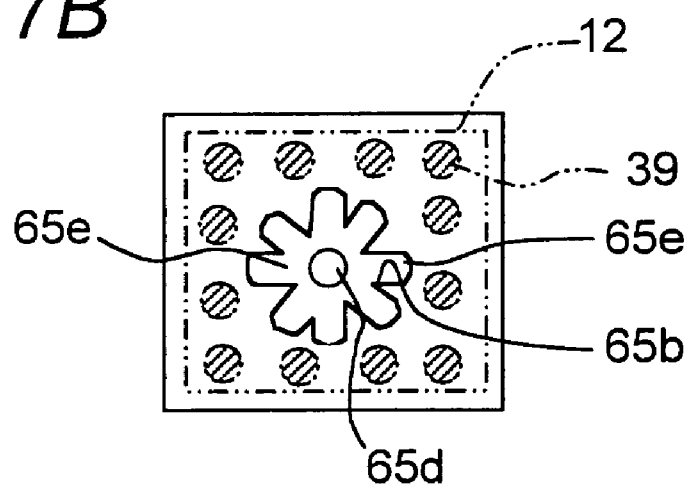
FIG. 17B is a schematic bottom view of the suction nozzle shown in FIG. 17A.
Figure 17C:
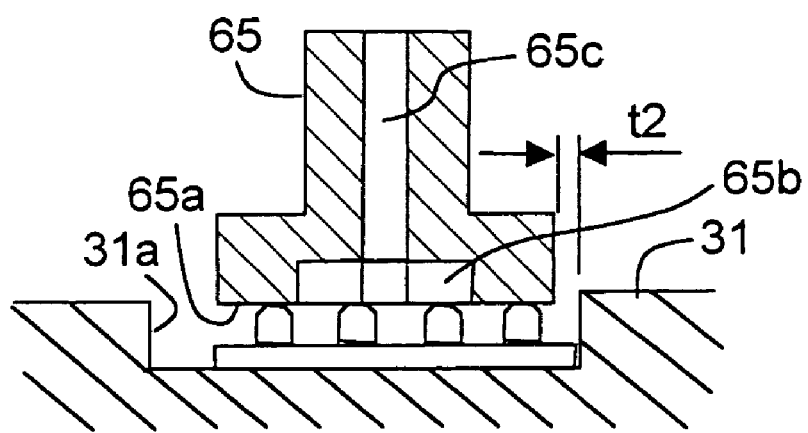
FIG. 17C is a schematic longitudinal sectional view illustrating a relationship between the concavity of the tray and the suction nozzle shown in FIG. 17A.

The shapes of the suction nozzle 65 and suction hole 65*b* are not limited to those shown in FIGS. 16A to 16C. For example, as shown in FIG. 17A through FIG. 17C, eight branch sections 65*e* arranged with angular spaces of 45 degrees in the plan view or bottom view thereof can be provided.

The component mounting head device 24 will be described below in detail. Referring to FIGS. 1, 2, and 18, the component mounting head device 24 comprises a base unit 111 installed on the X axis robot 67 actuated by the motor 66 and can move along the X axis direction. A holder 112 is attached to the base unit 111. The holder 112 can move in the vertical direction with respect to the base unit 111 by a linear guide 113. A ball threaded shaft 114 extending in the vertical direction is rotatably supported by the base unit 111. An internal threaded section 115 fixed to the holder 112 is engaged to the ball threaded shaft 114. When the ball threaded shaft 114 is rotated by a motor 68, the holder 112 is moved upward or downward according to a rotation direction thereof.

A rotary shaft mechanism 116 extending in the vertical direction is rotatably supported by the holder 112. A heater 117 for heating the electronic component 12 is fixed to a lower end side of the rotary shaft mechanism 116. Further, the suction nozzle 118 is attached in a replaceable manner to a lower side of the heater 117. In the present embodiment, the heater 117 is a pulse ceramic heater as a surface heater. However, the type of the heater is not specifically limited as long as it is adapted to heat the electronic component 12 held by the suction nozzle 118.

A pulley 120 is fixed to an upper end side of the rotary shaft mechanism 116. A motor 69 is fixed to the holder 112 so that the output shaft of the motor 69 is oriented vertically upward. A pulley 121 is fixed to an output shaft of the motor 69. A drive belt 122 is arranged between the pulleys 120, 121. Therefore, the rotation of the motor 69 is transmitted to the rotary shaft mechanism 116 through the pulleys 120, 121 and drive belt 122.

Figure 19:
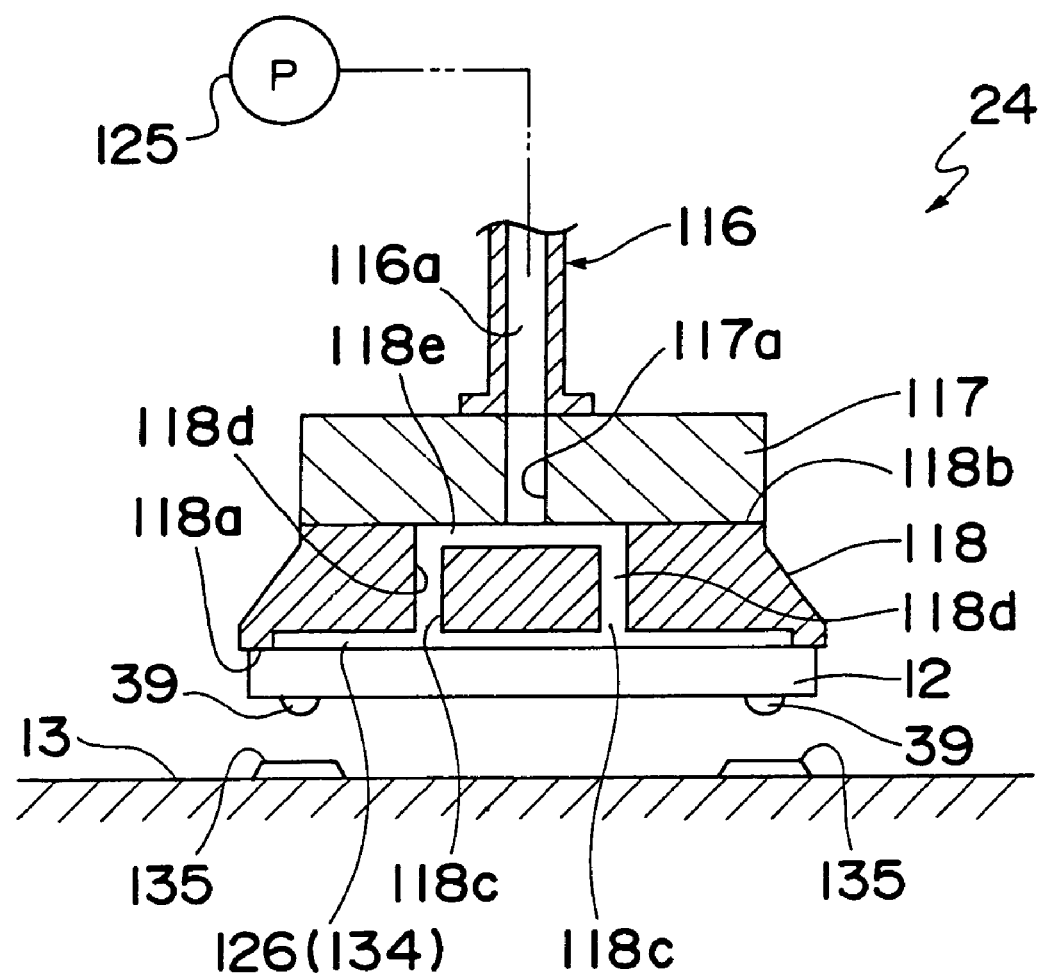
FIG. 19 is a schematic cross-sectional view of a suction nozzle in the component mounting head device.
Figure 20A:
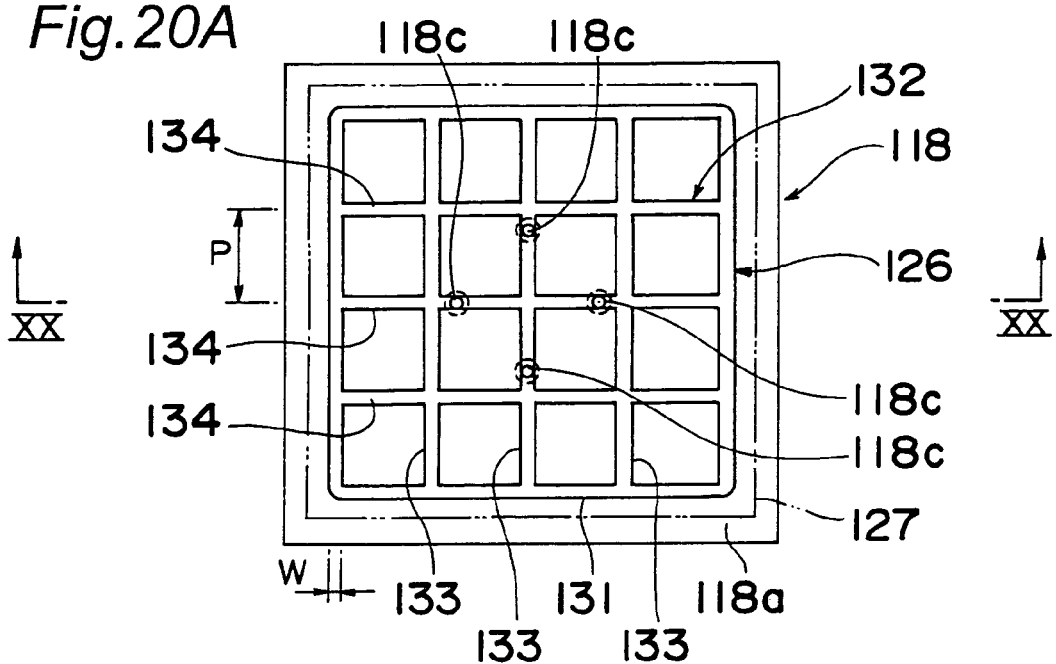
FIG. 20A is a schematic bottom view of the suction nozzle shown in FIG. 19.
Figure 20B:
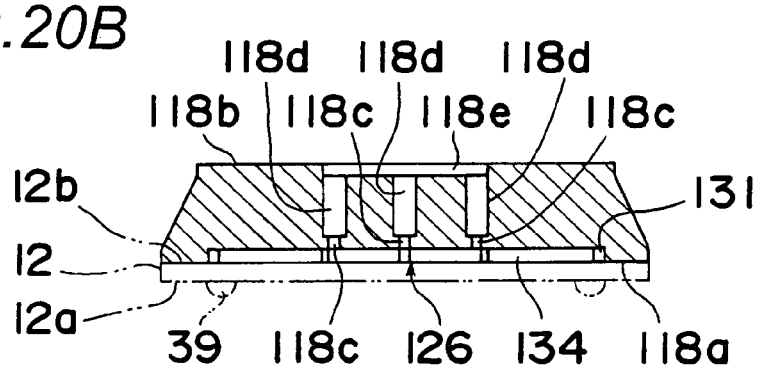
FIG. 20B is a cross-sectional view along a line XX-XX in FIG. 20A.
Figure 20C:
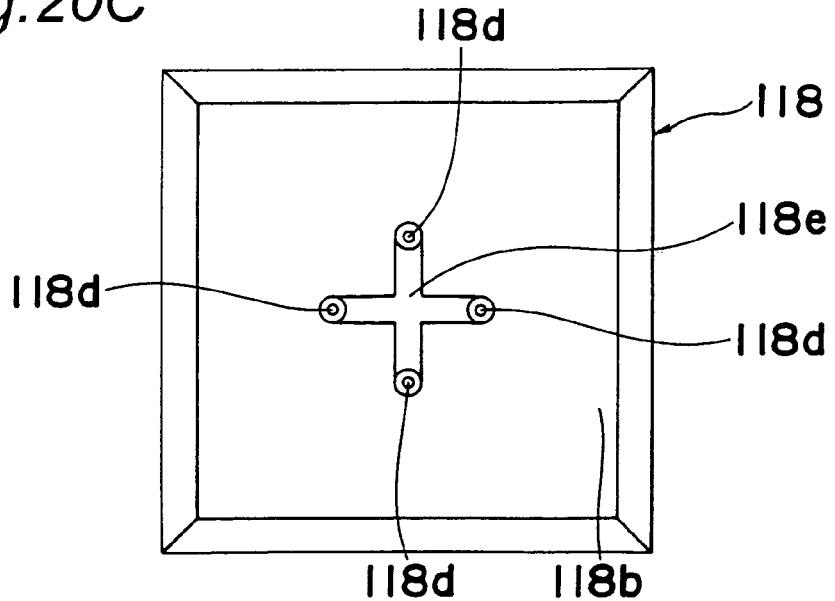
FIG. 20C is a schematic plan view of the suction nozzle shown in FIG. 19.

Referring to FIGS. 19 to 20C, the suction nozzle 118 comprises a flat distal end section 118a for sucking and holding the non-mounting side surface 12b of the electronic component 12 and a proximal end surface 118b opposite to the distal end surface 118a and abutting against the heater 117.

Four suction holes 118c are opened in the distal end surface 118a. Four suction passages 118d each of which is communicated with respective suction holes 118c at one end thereof are formed in the suction nozzle 118. The other ends of the suction passages 118d are communicated with a cross-shaped aggregation groove 118e formed in the proximal end surface 118b. A suction passage 117a communicated with the aggregation groove 118e at one end thereof is formed in the heater 117. The other end of the suction passage 117a is connected to the vacuum pump 125 (shown only in FIG. 19) through a suction passage 116a formed in the rotary shaft mechanism 116. Therefore, the suction holes 118c are communicated with the vacuum pump 125 through the suction passages 118d, 117a, and 116a.

Further, a suction groove 126 communicated with the suction passage 118c are formed in the distal end surface 118a. As shown in FIG. 20A, in the distal end surface 118a of the suction nozzle, the suction grooves 126 are formed so as to extend in an entire area corresponding to the area of the mounting side surface 12a of the electronic component 12 where the bump 39 was formed (joining area 127). Furthermore, the suction grooves 126 are formed with a uniform pitch in the area of the distal end surface 118a corresponding to the joining area 127.

In the present embodiment, the suction groove 126 comprises one rectangular section (closed pattern section) 131 and a lattice-shaped section 132 disposed inside the rectangular section 131. The rectangular section 131 is formed along the peripheral edge of the distal end surface 118a. The lattice-shaped section 132 comprises three longitudinal straight line sections 133 and three lateral straight line sections 134. The longitudinal straight line sections 133 are disposed so as to extend in the up-down direction in FIG. 20A, and are parallel to each other. Both ends of each longitudinal straight line section 133 are communicated with the rectangular section 131. The lateral straight line sections 134 are disposed so as to extend in the left-right direction in FIG. 20A, that is, in the direction perpendicular to the longitudinal straight line sections 133, and are parallel to each other. Similarly to the longitudinal straight line sections 133, both ends of the lateral straight line sections 134 are communicated with the rectangular section 131. Further, each lateral straight line section 134 is communicated with the intersecting longitudinal straight line section 133. Two suction holes 118c are opened in the longitudinal straight line section 133 located in the center. Further, two suction holes 118c are opened in the lateral straight line section 134 located in the center.

The electronic component 12 is sucked and held by the suction nozzle 118 at the non-mounting side surface 12b. A suction force (negative pressure) of the vacuum pump 125 is transferred to the suction holes 118c and suction grooves 126 through the suction passages 116a, 117a, and 118d, and the suction force acts on the non-mounting side surface 12b of the electronic component 12 from both the suction holes 118c and the suction grooves 126. Because the suction force acts on the non-mounting side surface 12b of the electronic component 12 not only from the suction holes 118c, but also from the suction grooves 126, the entire area of the non-mounting side surface 12b corresponding to the joining area 127 is tightly sucked and held to the distal end surface 118a of the suction nozzle 118. In other words, the electronic component 12 is sucked and held to the suction nozzle 118 in a state with a high degree of flatness and warping of the electronic component 12 is substantially reduced. Because the electronic component 12 is tightly sucked and held to the suction nozzle 118 with a high degree of fatness, the heat generated by the heater 117 is uniformly transmitted to the entire joining area 127 of the electronic component 12. As a result, the uniformity of temperature distribution in the joining area 127 is enhanced, and thus the bumps 39 are heated uniformly. Therefore, the bumps 39 can be joined to the substrate electrodes 135 in a uniform joining state.

In order for the suction nozzle 118 to suck and hold the electronic component 12 tightly and with the high degree of flatness, it is preferred that the suction grooves 126 be densely and uniformly disposed at least in the center region of the distal end surface 118a corresponding to the joining area 127. Referring to FIG. 20A, it is preferred that a width "w" and pitch "p" of the suction grooves 126 is smaller and that that a large number of grooves is present in the joining area 127. For example, in a case where an electronic component 12 in the form of a square with a side of about 10 mm and a thickness of about 0.1 mm is sucked and held by the suction nozzle having the suction groove 126, the width "w" set at 0.2 mm and the pitch "p" set at 1 mm, the warping of the electronic component 12 is reduced to about 5 µm.

Figure 21A:
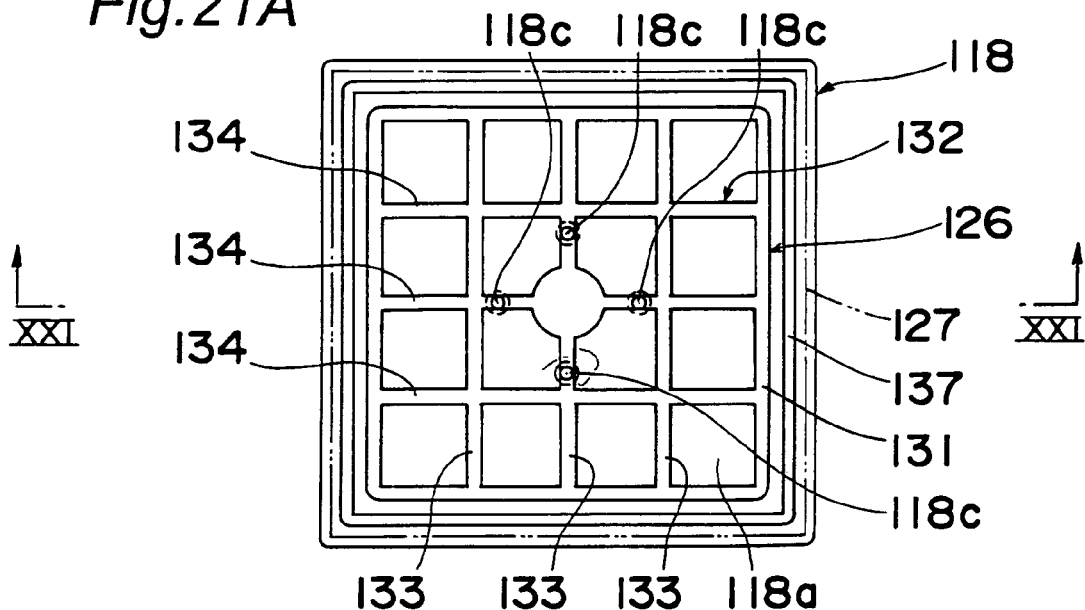
FIG. 21A is a bottom view of a first alternative suction nozzle for the component mounting head device.
Figure 21B:
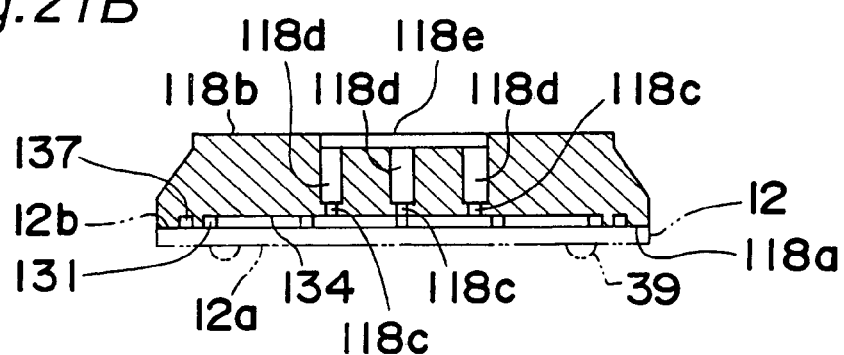
FIG. 21B is a cross-sectional view along a line XXI-XXI in FIG. 21A.
Figure 21C:
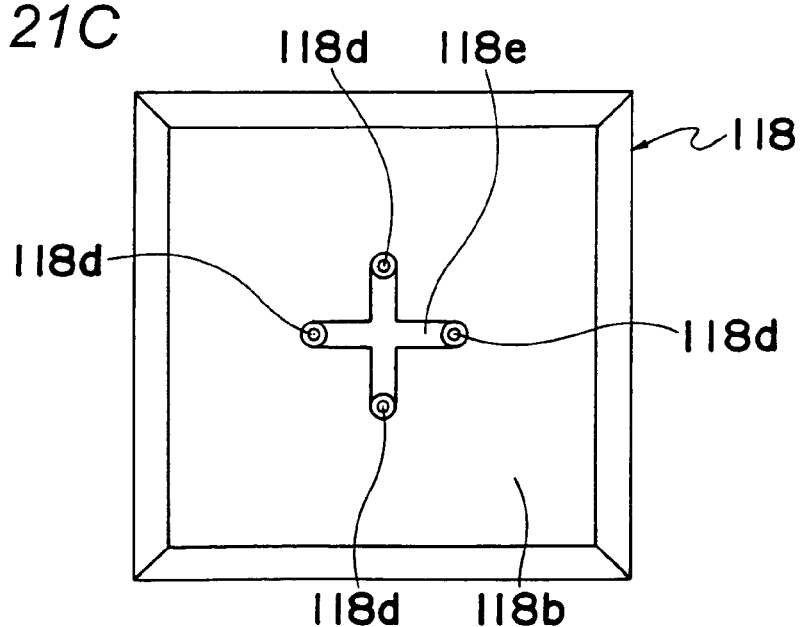
FIG. 21C is a schematic plan view of the suction nozzle shown in FIG. 21A.

FIG. 21A to FIG. 21C illustrate a first alternative of the suction nozzle 118 of the component mounting head device 24. A rectangular recess 137 is formed in the distal end surface 118a of the suction nozzle 118 between the rectangular section 131 of the suction groove 126 and the peripheral edge of the distal end surface 118a. Unlike the suction groove 126, this recess 137 is not communicated with the suction holes 118c and is not affected by the suction force of the vacuum pump 125.

Even if the air is introduced from a very minute gap between the peripheral edge of the distal end surface 118a of the suction nozzle 118 and the electronic component 12 sucked and held by the suction nozzle 118, the introduced air is heated while passing through the recess 137 and then passes to the center area of the distal end surface 118a. As a result, the region of the distal end surface 118a of the suction nozzle 118 corresponding to the joining surface 127 is prevented from being cooled by the air introduced from the gap. Therefore, providing the recess 137 in addition to the suction grooves 126 in the distal end surface 118a further improves the uniformity of temperature distribution in the joining area 127 of the electronic component 12 held by the suction nozzle 118. Other structures and operations of the alternative shown in FIGS. 21A to FIG. 21C are identical to those of the suction nozzle 118 shown in FIGS. 19 to 20C.

Figure 22A:
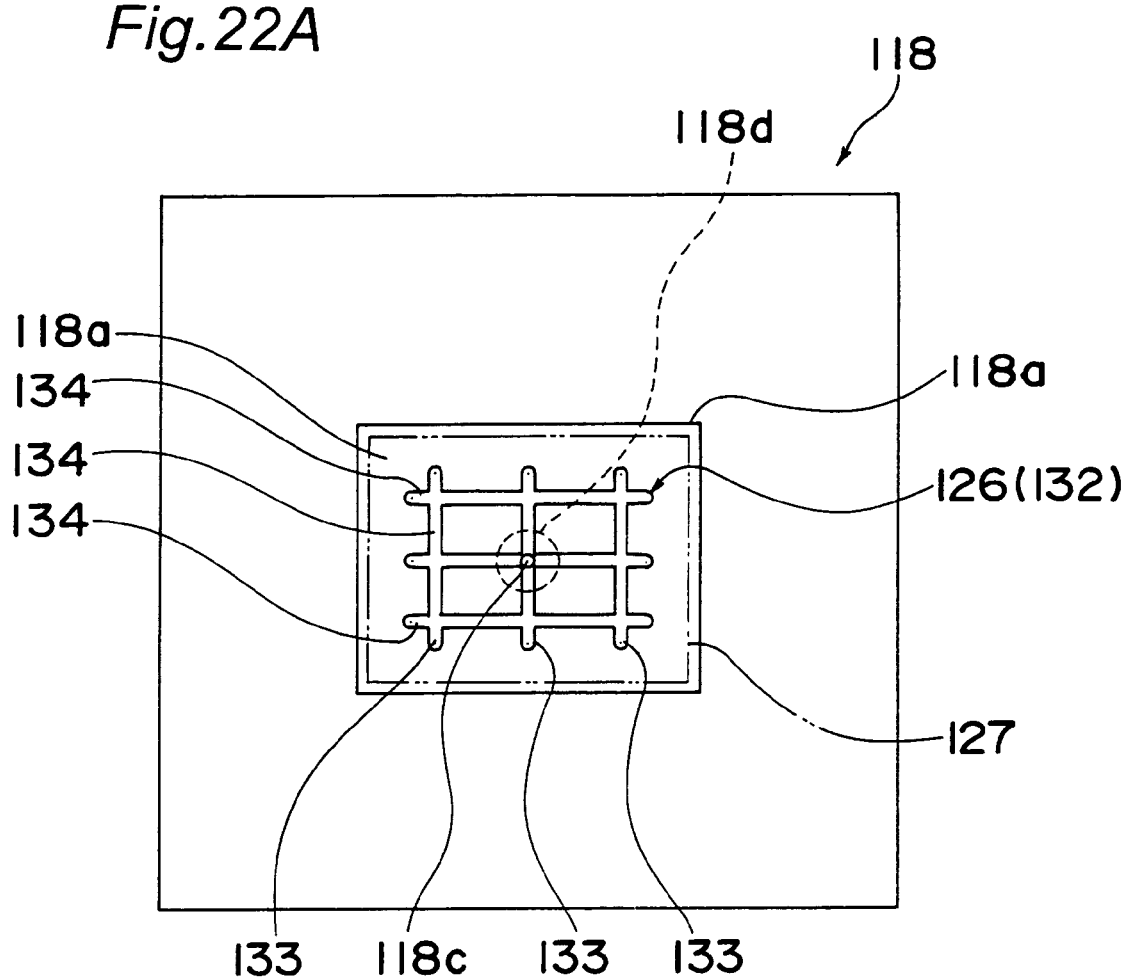
FIG. 22A is a schematic bottom view of a second alternative suction nozzle for the component mounting head device.
Figure 22B:
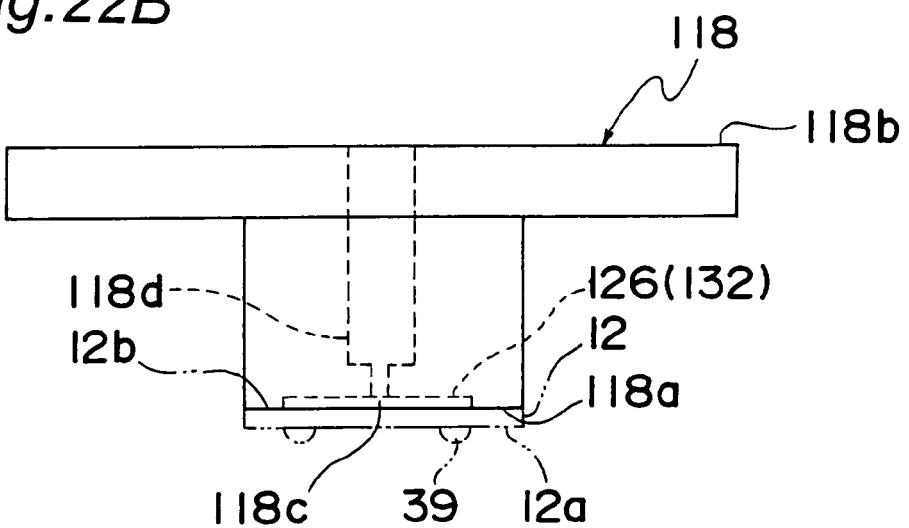
FIG. 22B is a schematic side view of the suction nozzle shown in FIG. 22A.

FIGS. 22A to FIG. 22C illustrate a second alternative of the suction nozzle 118 of the component mounting head device 24. In this alternative, the suction groove 126 formed in the distal end surface 118a of the suction nozzle 118 comprises the lattice-shaped section including three longitudinal straight line sections 133 and three lateral straight line sections 134, but has no rectangular section 131 (see FIG. 20A). Further, the suction nozzle 118 is formed with one suction hole 118c communicated with a center portion of the lattice-shaped section 132 at one end thereof.

FIGS. 23A to FIG. 23E illustrate other various alternatives of the suction nozzle 118. In the alternative suction nozzle shown in FIG. 23A, the suction groove 126 comprises three rectangular sections 131 disposed concentrically so as to surround a center 138 of the area of the distal end surface 118a corresponding to the joining area 127. Further, the suction groove 126 comprises four straight line sections 139 extending radially from the center 138 of the area of the distal end surface 118a corresponding to the joining area 127. Each of the straight line sections 139 is communicated with the rectangular section 131 at an inner side at one end thereof as well as the rectangular section 131 at an outer side at the other end thereof. Furthermore, the straight line sections 139 cross the rectangular frame-shaped section 131 at an intermediate position. The suction nozzle 118 comprises four suction holes 118c each of which is communicated with the suction groove 126 in intersection positions of the straight line sections 139 and the inner rectangular section 131.

Figure 23A:
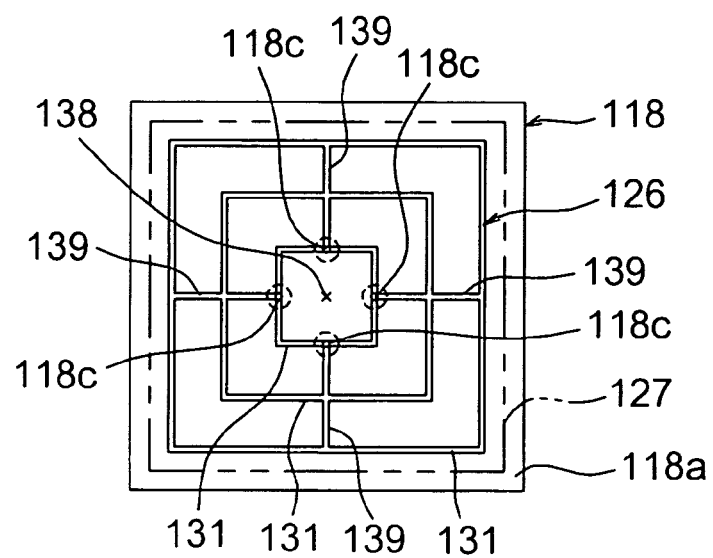
FIG. 23A is a schematic bottom view of an alternative suction nozzle in the component mounting head device.
Figure 23B:
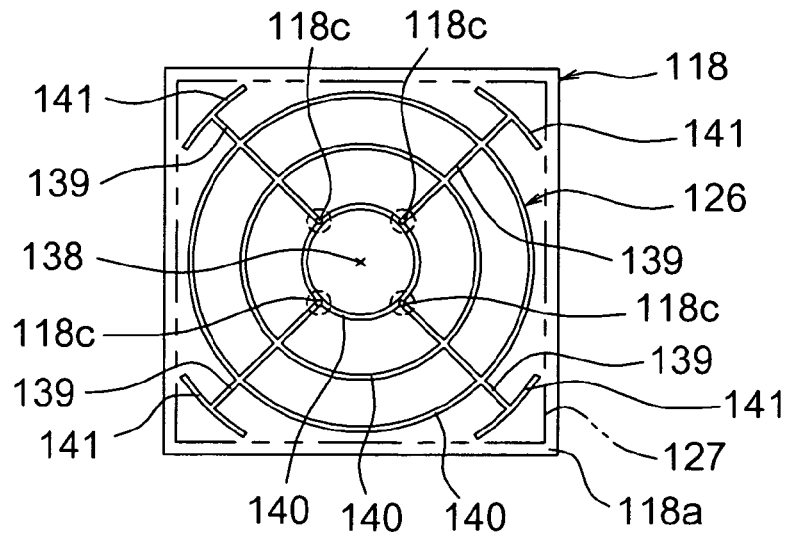
FIG. 23B is a schematic bottom view of an alternative suction nozzle in the component mounting head device.

In the alternative shown in FIG. 23B, the suction groove 126 comprises three circular sections 140 disposed concentrically so as to surround the center 138 of the area corresponding to the joining area 127. Further, the suction groove 126 comprises four straight line sections 139 extending radially from the center 138. Each straight line section 139 is communicated with the circular section 140 at an inner side. Further, each straight line section 139 crosses the circular sections 140 at an intermediate position and an outer side and is communicated with thereto. The suction groove 126 comprises four circular arc sections 141 between the outer circular section 140 and the peripheral edge of the distal end surface 118a. The other end of each straight line sections 139 extending beyond the outer circular section 140 to the peripheral edge side of the distal end surface 118a is communicated with the circular arc section 141. The suction nozzle 118 comprises four suction holes 118c each of which is communicated with the suction groove 126 in intersection positions of the straight line sections 139 and the inner circular section 140.

Figure 23C:
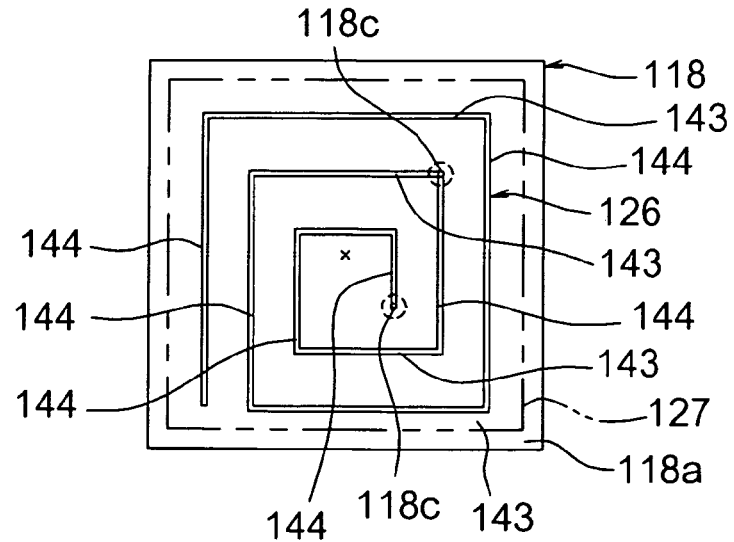
FIG. 23C is a schematic bottom view of an alternative suction nozzle in the component mounting head device.

In the alternative shown in FIG. 23C, the suction groove 126 has a single line-like shape. Specifically, the suction groove 126 has a spiral shape formed by connecting together a plurality of straight line sections 143 extending parallel to lateral sides in FIG. 23C of four sides defining the peripheral edge of the distal end surface 118a of the suction nozzle 118 and a plurality of straight line sections 144 extending parallel to longitudinal sides of the peripheral edge of the distal end surface 118a. The suction nozzle 118 comprises two suction holes 118c. One of suction holes 118c is communicated with the suction groove 126 in the inner end section of the suction groove, and the other suction hole 118c is communicated with the suction groove 126 between the inner end section and an outer end section of the suction groove 126.

Figure 23D:
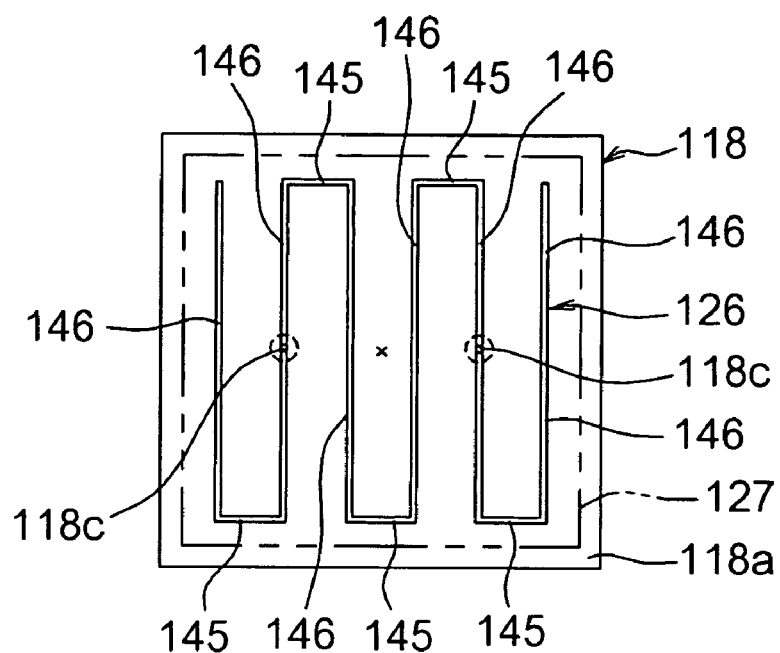
FIG. 23D is a schematic bottom view of an alternative suction nozzle in the component mounting head device.

The alternative suction groove 126 shown in FIG. 23D also has a single line-like shape. Specifically, the suction groove 126 has a rectangular wave-like shape formed by connecting a plurality of straight line sections 145 extending parallel to lateral sides of the distal end surface 118a of the suction nozzle 118 and a plurality of straight line sections 146 extending parallel to longitudinal sides. The suction nozzle 118 comprises two suction holes 118c that are communicated with the suction groove 126 at the longitudinal straight line sections 146.

Figure 23E:
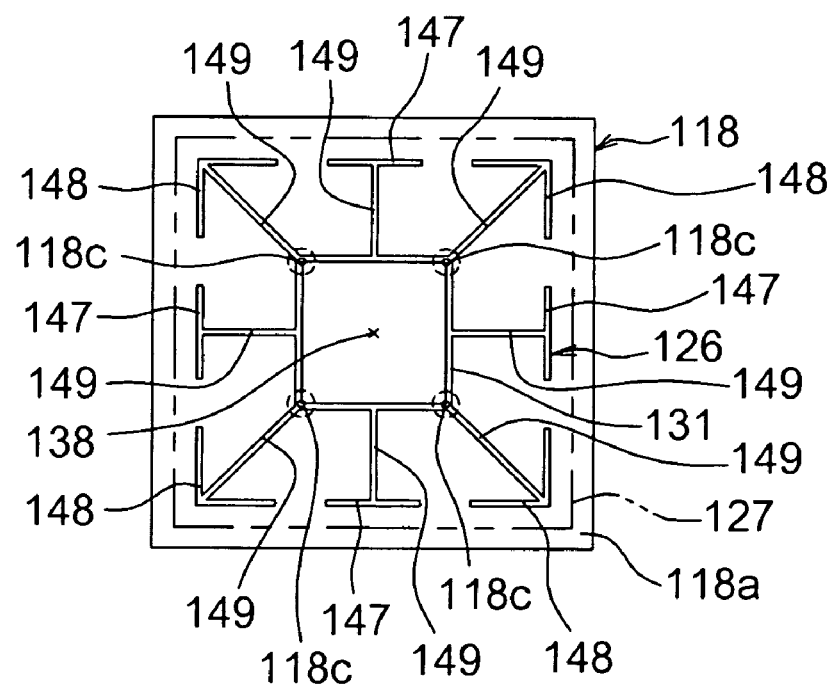
FIG. 23E is a schematic bottom view of an alternative suction nozzle in the component mounting head device.
Figure 25A:
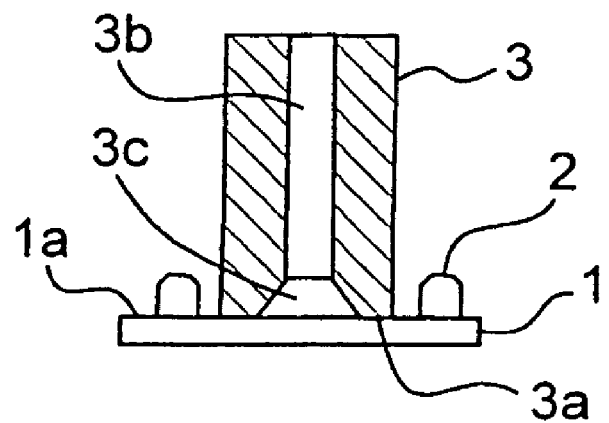
FIG. 25A is a schematic cross-sectional view illustrating a suction nozzle of a conventional component supply head device.
Figure 25B:
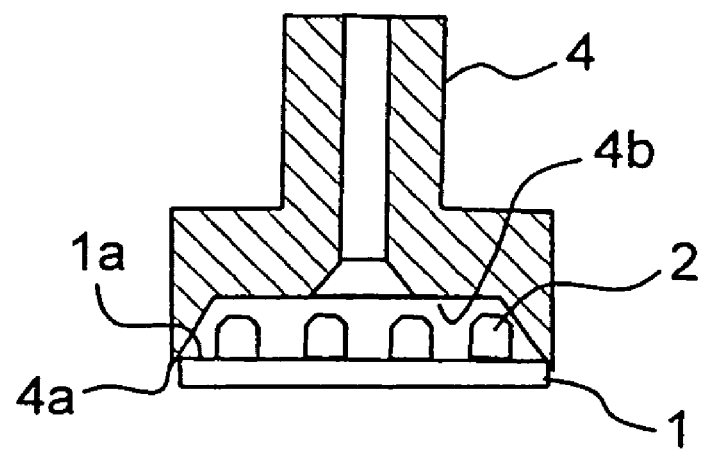
FIG. 25B is a schematic cross-sectional view illustrating a suction nozzle of a conventional component supply head device.
Figure 26:
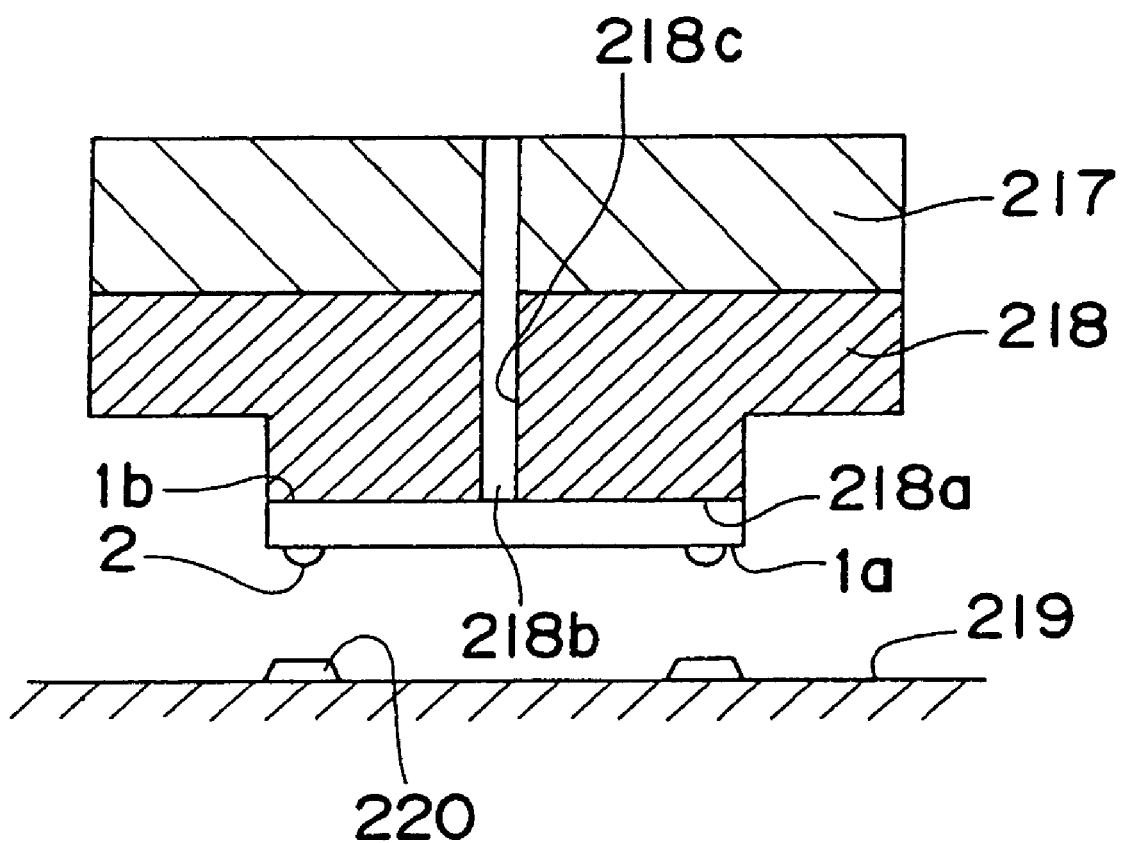
FIG. 26 is a schematic cross-sectional view illustrating a suction nozzle of the conventional component mounting head device.

In the alternative shown in FIG. 23E, the suction groove 126 comprises one rectangular section 131 surrounding the center 138 of the area of the distal end surface 118a corresponding to the joining area 127. Further, the suction groove 126 comprises four straight line sections 147 and four polygonal line sections 148 between the rectangular section 131 and the peripheral edge of the distal end surface 118a. Those straight line sections 147 and polygonal line sections 148 are disposed on a virtual rectangle concentric with the rectangular section 131 and larger in size than the rectangular section 131. Further, the suction groove 126 comprises eight straight line sections 149 extending radially with respect to the center 138. One end of each straight line section 149 is communicated with the rectangular section 131 and the other end is communicated with the straight line sections 147 or polygonal line sections 148. The suction nozzle 118 comprises four suction holes 118c that are communicated with the suction groove 126 at corners of the rectangular section 131.

The shape, size, number, and arrangement position of the suction hole, suction grooves and recesses formed in the distal end surface of the suction nozzle 118 of the component mounting head device 24 are not limited to the above-described examples and can be easily set according to the size, and shape of the electronic components 12 and the number of bumps 39 so that the area of the non-mounting side surface 12b of the electronic component 12 corresponding to the joining area 127 is brought into tight contact with the distal end surface 118a of the suction nozzle 118.

Referring to FIGS. 24A to 24D, the operations of taking the electronic component 12 out of the plate disposing device 19 by the reversing head device 22 and mounting on the substrate 13 by the mounting head device 24 will be described below. First, as shown in FIG. 24A, at the supply position P1 of the electronic component 12 corresponding to the plate disposing device 19, the suction nozzle 65 of the reversing head device 22 sucks and holds the electronic component 12 from the wafer supply plate 29 or tray supply plate 30. At this operation the suction nozzle 65 holds the mounting side surface 12a of the electronic component 12 oriented upward in the vertical direction.

As shown in FIG. 24B, the suction nozzle 65 rises and the mounting head device 24 moves to the transfer position P2. Then, the reversing head device 22 holding the electronic component 12 by the suction nozzle 65 moves to the transfer position P2 and is positioned below the mounting head device 24. The orientation of the reverse head 103 is then reversed. As a result, the non-mounting side surface 12b of the electronic component 12 opposite to the mounting side surface 12a is oriented upward in the vertical direction. Then, as shown in FIG. 24C, the suction nozzle 118 of the mounting head device 24 is lowered so as to suck and hold the electronic component 12. The electronic component 12 is held by the holding section 70 in a posture where the mounting side surface 12a faces down in the vertical direction (posture in which the non-mounting side surface 12b faces up in the vertical direction).

As shown in FIG. 24D, the mounting head device 24 moves above the substrate 13 and the electronic component 12 is aligned with respect to the substrate 13 so that the substrate electrodes 135 and bumps 39 are corresponded to each other. Then, the suction nozzle 118 is lowered so that the bumps 39 are pressed against the substrate electrodes 135. Further, the electronic component 12 is heated by the heater 117. The bump 39 and substrate electrode 135 are joined by the pressing and heating, and the electronic component 12 is mounted onto the substrate 13.

As described, the suction nozzle 65 of the reversing head device 22 holds the electronic component 12 in the state where the distal end surface 65a of the suction nozzle is not in contact with the mounting side surface 12a. Therefore, the suction force acts uniformly on the entire mounting side surface 12a and the electronic component 12 can be held by the suction nozzle 65 with high accuracy, without causing deformation such as warping due to the excess suction force. As a result, the accuracy of transferring the component from the reversing head device 22 to the component mounting head device 24 is enhanced. Further, suction grooves 126 communicated with the suction holes 118c are formed over the entire area corresponding to the joining area 127 of the electronic component 12 in the distal end surface 118a of the suction nozzle 118 of the component mounting head device 24. Therefore, the area of the non-mounting side surface 12b of the electronic component 12 corresponding to the joining area 127 is tightly sucked and held to the distal end surface 118a of the suction nozzle 118 with a high degree of flatness. As a result, the uniformity of temperature distribution in the joining area 127 is enhanced and the bumps 39 are heated uniformly. Therefore, the bumps 39 can be joined to the substrate electrodes 135 in a uniform joining state.

Although the present invention has been fully described with reference to the accompanying drawings, various changes and modifications will be apparent to those skilled in the art. Therefore, such changes and modifications should be construed as included in the present invention, unless they depart from the scope and spirit of the present invention.

The invention claimed is:

1. A method for mounting a component onto a substrate, the method comprising:
   providing a tray for accommodating the component;
   providing a component supply head device having a first suction nozzle which comprises a distal end surface, a suction hole opened in the distal end surface, and a suction passage communicated with the suction hole at one end thereof;
   providing a component mounting head device having a second suction nozzle;
   accommodating the component in a concave section of the tray, the component having a mounting side surface on which protruding electrodes are provided and a non-mounting side surface opposite to the mounting side surface, and the mounting side surface being oriented upward;
   moving the component supply head so that a portion of the distal end surface of the first suction nozzle outside the suction hole contacts tip ends of the protruding electrodes of the component accommodated in the concave portion of the tray so that an outer peripheral edge of the distal end surface is positioned inside an outer peripheral edge of the component and outside the protruding electrodes, and so that the suction hole is opposed with a gap to a portion of the mounting side surface where the protruding electrodes are not provided;
   generating an air flow flowing from the gap between the suction hole and the mounting side surface into the suction passage through the suction hole by vacuum suction force acting from the other end of the suction passage, the air flow generating a negative pressure for holding the component accommodated in the concave section to the distal end surface of the first suction nozzle;
   moving the component supply head device to a component transfer position so that the component supply head device is positioned below the component mounting head device;
   reversing an orientation of the first suction nozzle of the component supply head device so that the non-mounting side surface is oriented upward and the mounting side surface is oriented downward;
   holding the non-mounting side surface of the component by the second suction nozzle of the component mounting head device;
   moving the component mounting head device from the component transfer position to a position above a component mounting position where the substrate is disposed; and
   lowering the second suction nozzle of the component mounting head device so as to press and join the protruding electrodes to electrodes of the substrate.

2. The method according to claim 1, wherein the suction hole of the first suction nozzle comprises a center section communicated with the suction passage and a plurality of branch sections extending radially from the center section so as to be in fluid communication with the center section.

3. The method according to claim 2, wherein the outer periphery of the distal end surface of the first suction nozzle fits within the outer periphery of the concave portion of the tray.

* * * * *